(12) United States Patent
Cojocneanu et al.

(10) Patent No.: US 11,237,208 B2
(45) Date of Patent: Feb. 1, 2022

(54) APPARATUS AND METHOD FOR TESTING SEMICONDUCTOR DEVICES

(71) Applicant: Testmetrix, Inc., Milpitas, CA (US)

(72) Inventors: Christian O. Cojocneanu, Milpitas, CA (US); Lucian Scurtu, Codlea Brasov (RO)

(73) Assignee: Testmetrix, Inc., San Jose, CA (US)

( * ) Notice: Subject to any disclaimer, the term of this patent is extended or adjusted under 35 U.S.C. 154(b) by 0 days.

(21) Appl. No.: 16/532,388

(22) Filed: Aug. 5, 2019

(65) Prior Publication Data

US 2020/0041564 A1 Feb. 6, 2020

Related U.S. Application Data

(60) Provisional application No. 62/715,259, filed on Aug. 6, 2018.

(51) Int. Cl.
*G01R 31/28* (2006.01)
*H05K 7/20* (2006.01)
*G01R 31/27* (2006.01)

(52) U.S. Cl.
CPC ....... *G01R 31/2884* (2013.01); *G01R 31/275* (2013.01); *G01R 31/2887* (2013.01); *G01R 31/2896* (2013.01); *H05K 7/20272* (2013.01)

(58) Field of Classification Search
CPC ............ G01R 31/2884; G01R 31/2887; G01R 31/275; G01R 31/2896; G01R 31/2867; G01R 1/0491; G01R 31/2889; G01R 31/2868; G01R 1/0458; G01R 31/2893; H05K 7/20272
See application file for complete search history.

(56) References Cited

U.S. PATENT DOCUMENTS

| | | | | |
|---|---|---|---|---|
| 6,040,691 A | * | 3/2000 | Hanners | G01R 31/2891 324/756.07 |
| 6,218,910 B1 | * | 4/2001 | Miller | G01R 1/06766 333/33 |
| 6,927,593 B2 | | 8/2005 | Kline | |
| 7,019,546 B1 | * | 3/2006 | Miller | G01R 31/2891 324/756.03 |
| 7,528,617 B2 | * | 5/2009 | Cojocneanu | G01R 31/2887 324/756.07 |
| 7,845,477 B2 | * | 12/2010 | Laukemann | B60T 10/02 188/296 |
| 9,400,309 B2 | | 7/2016 | Kiyofuji et al. | |

(Continued)

*Primary Examiner* — Daniel R Miller
(74) *Attorney, Agent, or Firm* — Owens Law Firm, PC

(57) ABSTRACT

The invention is a test system for testing silicon wafers or packaged devices. The system includes a tester having multiple testing stacks that each hold a vertical stack of test engines, data buffers, pin drivers, and other resources, which are electrically connected on one side to a wafer or DUT and on the other side to a test host computer via fast data links. Each testing stack is disposed on a top side of a wafer contactor electrically connected to a wafer or a load board electrically connected to a DUT. The system includes a cooling system to remove heat during operation. The system minimizes the data signal path between the pads of the devices being tested and the pin drivers of the tester, the test engines, and the test host computer. High performance is possible by the connection of bottom of each testing stack directly to the wafer contactor.

16 Claims, 18 Drawing Sheets

(56) References Cited

U.S. PATENT DOCUMENTS

| | | | |
|---|---|---|---|
| 2002/0171133 A1* | 11/2002 | Mok | H01L 24/10 257/678 |
| 2004/0189280 A1* | 9/2004 | Mirkhani | G01R 31/2851 324/750.09 |
| 2006/0006892 A1* | 1/2006 | Green | G01R 31/2886 324/754.03 |
| 2010/0231250 A1* | 9/2010 | Breinlinger | G01R 31/2889 324/750.08 |
| 2014/0306727 A1 | 10/2014 | Lee et al. | |

* cited by examiner

APPARATUS AND METHOD FOR TESTING SEMICONDUCTOR DEVICES

CROSS-REFERENCE TO RELATED APPLICATIONS

This application claims the benefit of provisional Application No. 62/715,259, filed Aug. 6, 2018. The entirety of the foregoing application is incorporated by reference herein.

BACKGROUND OF THE INVENTION

Field of the Invention

The invention in its various embodiments relates generally to equipment for testing semiconductor devices, such as semiconductor wafers, and methods for such testing. In particular, the invention in its various embodiments relates to a compact, high-speed system for testing semiconductor wafers by replacing the customary probe cards with a plurality of vertical stacks holding test engines, data buffers, pin drivers and other necessary test resources, wherein each stack is located directly above the wafer area allocated for it to test.

Description of Related Art

The integrated circuits on semiconductor wafers are typically tested for functional defects prior to die packaging. It is desirable to perform such testing as efficiently and economically as possible. Therefore, there is a need for testing equipment that provides efficient and economical testing of semiconductor devices, including semiconductor wafers. Accordingly, automated, multi-site testing is imperative. However, the large size of the test equipment needed to provide such automated, multi-site testing is an impediment. In addition, the test speed for semiconductor wafers is rapidly increasing, and reducing the tester size is critical since signal propagation speed is indirectly proportional with signal trace lengths. Accordingly, there is a need for a compact testing system that addresses these issues and that strives to achieve a Minimum Signal Path Length (MSPL) to the Device Under Test (DUT).

BRIEF SUMMARY OF THE INVENTION

In general, the invention comprises a system for testing semiconductor devices, including, but not limited to, silicon wafers. In some embodiments, the system comprises a wafer tester that includes a plurality of testing stacks, a wafer contactor, and a cooling system. Each testing stack represents a test channel that can hold a plurality and variety of test engines, data buffers, pin drivers, and other necessary test resources organized in identical sized boards (collectively referred to as "test boards") that are aligned horizontally and stacked vertically on top of each other within a rectangular prism-shaped housing that includes a rectangular base and top and four side portions that extend vertically between the rectangular base and top. Each testing stack is disposed directly on top of the wafer contactor, which is a plate having a flat top surface to which the bottom of each testing stack is connected and an opposing flat bottom surface that contacts a wafer to be tested, which may be positioned under the wafer contactor by associated wafer handling equipment. An important distinction is that the testing stacks connect directly to the wafer contactor, thus eliminating the customary probe cards that are typically used to interface the pin driver boards to the wafer contactor. By doing so and by each testing stack being place directly above the dies or DUTs to be tested, the MSPL is achieved.

The cooling system includes a network of channels that pass a cooling fluid through the corner posts of the testing stacks to remove heat during operation. The cooling system may also include a plurality of fans located around the testing stacks, as well as in any compartment in which the wafer tester resides, to circulate ambient air around the wafer tester.

Each testing stack has circuitry for electrically connecting host test computers to each of the test boards in the testing stack and for electrically connecting the test boards in the testing stacks to the wafer contactor. The wafer contactor has circuitry that electrically connects each testing stack to the wafer or dies to be tested. This circuitry provides for data input/output between the host test computers, the test boards, and the wafer to be tested. In other embodiments, the testing stack is connected to load boards containing sockets for DUTs. In addition to signals, power is provided to the wafer contractor and the power pads of the wafer to be tested from a power server board, which acts as the power source for the devices to be tested. Power is also provided by separate power supplies to each of the testing stacks and test boards. In some embodiments the power for the devices to be tested is provided through the testing stack if the pin drivers contained in the test boards are able to supply the current needed by the dies on the Wafer Under Test (WUT).

The circuitry for electrically connecting host test computers to each of the test boards in the testing stack is included in the circuit board attached to the top of the testing stack. This circuit board contains the controller and test engines of the testing stack and consists of a rigid board mated to one or two or four flex circuit boards with extensions along one, two, or all four sides of the testing stack, extensions by which the testing stack controller and test engines are connected to the test boards inside the testing stack.

The circuitry for electrically connecting the testing stack to the DUTs such as wafer dies or discrete devices is contained in the circuit board attached to the bottom of the testing stack. This circuit board consists of a rigid board, mated to one, or two, or four flex circuit boards, with extensions along one, two, or four sides of the testing stack, extensions by which the testing stack bottom board electrically connects to each test boards within the testing stack. Each end of the flex circuits may also be attached to the center portion of the other circuit board. An electrical connector is attached to the bottom of each testing stack that is electrically connected on its top side to the bottom circuit board and that electrically connects to the top surface of the wafer contactor on its bottom side using, for example, pogo pins. In some embodiments, the wafer contactor has pads, such as gold pads and electrical traces, to which each of the electrical connectors on the testing stacks connects. The electrical traces pass through the wafer contactor to MEMs-type springs or other types of contacts for electrically contacting with the respective die areas of the wafer to be tested.

In use generally, each testing stack is configured with the desired test boards and is secured in position on top of the wafer contactor. Wafers to be tested or WUTs are provided to the bottom side of the wafer contactor using related wafer handling equipment. Alternatively, the testing system can be used to test packaged devices as well in which case a DUT load board would be used. Power is delivered to the testing stacks and to the wafer contactor and wafer dies and testing is commenced during which the cooling system is operated. During testing, data is transmitted to initiate and control the testing, and data is collected from the wafer being tested. The process is then repeated with another wafer to be tested.

It should be appreciated that the testing system of the present invention provides multiple benefits. The testing system of the present invention is a cost-effective, compact, highly modular design for testing high performance semiconductor devices and can serve as testers for parametrical and functional engineering device testers, wafer testers, and packaged device testers for final test. The use of testing stacks that are connected directly to a wafer contactor that, in turn, is connected to the wafer to be tested eliminates the need for a probe card. In addition, the placement of the testing stacks directly above the wafer being tested minimizes the length of the signal path for data transmission to and from the test boards and the wafer dies. The highest performance of the tester is made possible by the positioning of each test stack directly right above the respective wafer area assigned to it for testing, by the connection of the bottom of each testing stack directly to the wafer contactor, by the compact size of the tester stack, and by the connection of the top of each testing stack to a host test computer via fast data links over copper or optical fiber such as PCI Express (PCIe) or Thunderbolt Gigabit Ethernet. This achieves the minimum signal trace lengths between the test engine and the DUT and the minimum number of connectors that the signals pass through. The fast optical fiber data links between the test stacks and host test computers allows them to be placed outside clean rooms where the wafer testers are located but in data center-type rooms located up to 100 meters or more away from the test system.

In addition, the system has a compact size due to the elimination of much larger pin driver boards generally plugged into probe cards on the periphery of the wafer area. The modularity provides the ability to configure, remove, and replace the testing stacks as desired from the top side of the wafer contactor while keeping the DUT load board or the WUT contactor in place or alternatively by removing the DUT load board or WUT contactor while keeping the testing stacks in place.

DETAILED DESCRIPTION OF THE INVENTION

The present invention is more fully described below with reference to the accompanying Figures. While the invention will be described in conjunction with particular embodiments, it should be understood that the invention includes alternatives, modifications, and equivalents. Accordingly, the following description is exemplary in that several embodiments are described (e.g., by use of the terms "preferably," "for example," or "in one embodiment"), but this description should not be viewed as limiting or as setting forth the only embodiments of the invention, as the invention encompasses other embodiments not specifically recited in this description. Further, the use of the terms "invention," "present invention," "embodiment," and similar terms throughout this description are used broadly and are not intended to mean that the invention requires, or is limited to, any particular aspect being described or that such description is the only manner in which the invention may be made or used.

Generally, the invention comprises a system for testing semiconductor devices, including, but not limited to, silicon wafers and package integrated circuits. In some embodiments, the system comprises a plurality of vertical units for housing a plurality of pin drivers or test cards and a wafer contactor. In such embodiments, each vertical unit in the plurality of vertical units is connected, via a connector, to a first side of the wafer contactor. By adhering or attaching a wafer to be tested to a second side of the wafer contactor, a user may test the wafer using the plurality of test cards in the plurality of vertical units. A wafer to be tested may be semiconductor device or wafer to be under test the plurality of vertical units. The following description provides additional details about various components of the system and the methods used for employing the system for testing semiconductor devices.

It should be appreciated that the system may be used as follows, in accordance with one embodiment of the above invention. A user may insert one or more stacks of test cards for testing semiconductor devices, such as silicon wafers, into one or more vertical units. The user may connect the one or more vertical units to a first side of a wafer contactor using one or more connectors. To test a given silicon wafer, the user may adhere or attach the wafer to a second side of the wafer contactor. It should be appreciated that a robotic arm or other robotic circuitry may be activated to enable movement of the wafer such that the wafer adheres to the second side of the wafer contactor. The user may then signal the one or more stacks of test cards to test the wafer that is adhered to the second side of the wafer contactor.

Figure 1:
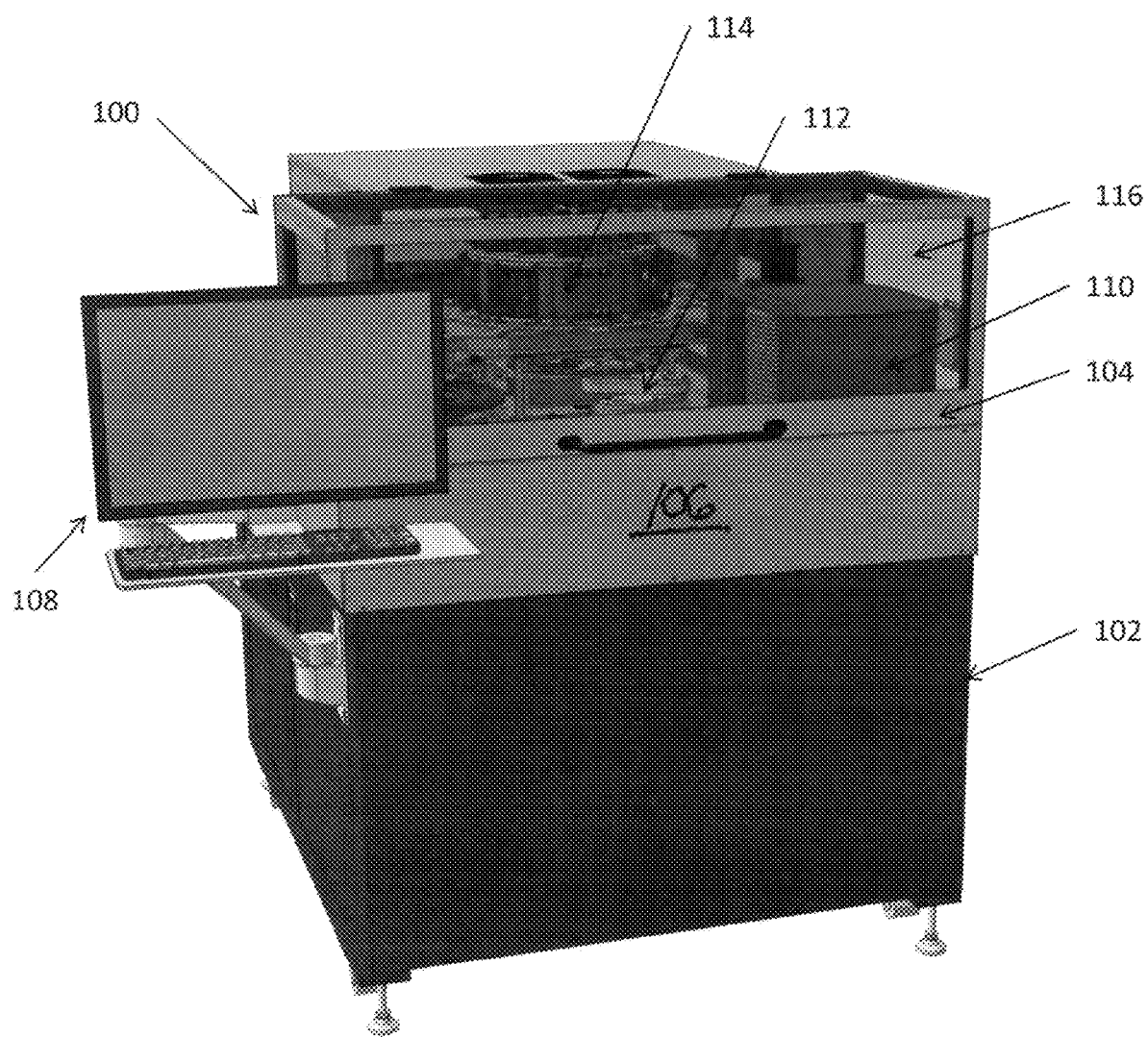
FIG. 1 illustrates a front perspective view of a system for testing semiconductor devices, according to one embodiment of the present invention.

FIG. 1 illustrates a front perspective view of a system for testing semiconductor devices, according to one embodiment of the present invention. As depicted, the system 100 generally comprises a cabinet 102, which itself comprises various components. These various components will be described in further detail in conjunction with the following figures. It should be appreciated that the cabinet 102, as shown, provides access to these various components through a hatch or door 104, as depicted in the cabinet's front-facing portion 106. Additionally, the system 100 comprises a personal computing device 108, which may be used to control the system or the various fixtures located within the system. A front opening unified pod (FOUP) 110 may be used for repository of wafers to be tested. A wafer handling system 112 may be used to transfer wafers to and from the FOUP for testing using a testing system 114. It should be appreciated that the FOUP 110 may be changed out once the wafers have been tested for another FOUP holding wafers to be tested. The FOUP 110 may be switched via the sliding door 116 on the side of the cabinet 102.

Figure 2:
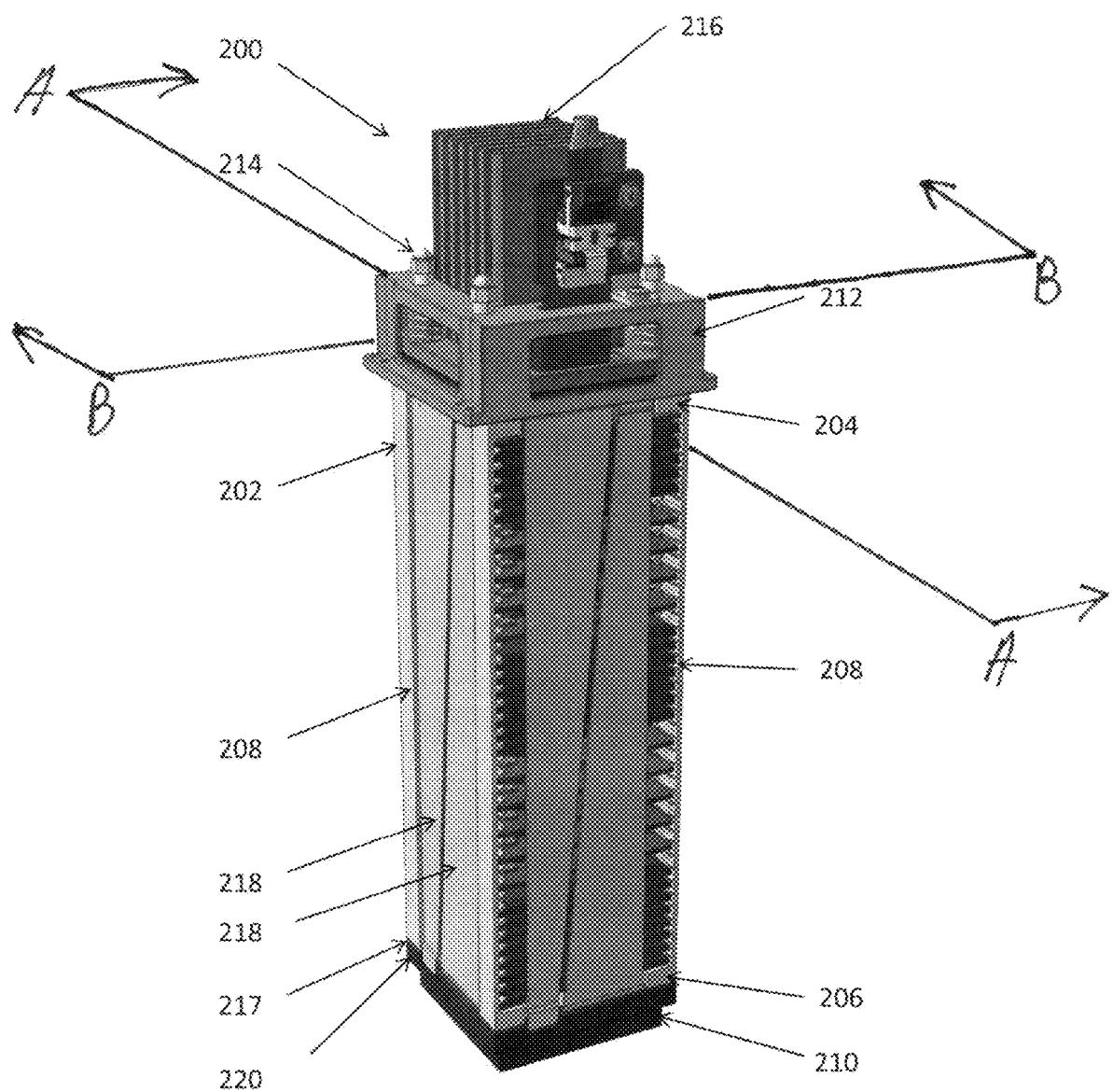
FIG. 2 illustrates a side perspective view of a testing stack for testing semiconductor devices according to one embodiment of the present invention.

FIG. 2 illustrates a side perspective view of a testing stack for testing semiconductor devices according to one embodiment of the present invention. Specifically, FIG. 2 depicts a single testing stack 200 that includes a frame or housing 202 (further illustrated in FIG. 8) that is generally in the shape of a rectangular prism and includes a top frame 204 and a bottom frame 206 and four corner portions 208 that extend from the top to the bottom of the housing 202 at each corner. It should be appreciated that there are openings on each side of the housing 202 and on the top and bottom sides of the housing 202. It should be appreciated that the housing 202 comprises a plurality of shelves within the housing 202, each configured to horizontally hold a pin driver, test card, or test board for testing semiconductor devices, thereby providing a stack of test cards extending from the bottom to the top of the housing 202. It should be appreciated that each testing stack 200 may hold various cards in addition to test cards or pin drivers, such as PHY interface chips or other dedicated components for SOC testing.

The testing stack 200 also comprises at least one electrical connector 210 located on a bottom side of the housing 202. The connector 210 is configured to physically and electrically connect to a top side of a wafer contactor (described further below in connection with FIG. 10) through the use of physical structures, including, for example, pogo pins or other structures known to one of skill in the art that enable a physical connection to the wafer contactor. In some embodiments, the connector 210 is a ceramic connector.

The testing stack 200 also comprises a cap 212 that can be connected to a top side of the housing 202 using at least one or more spring-loaded screws 214. When the cap 212 is affixed to a top side of the housing 202, the spring-loaded screws 214 may be used to exert force on the top side of the housing 202. Such force may be utilized to hold the testing stack 200 in place, thereby securing the physical and electrical connection between the connector 201 and the top side of the wafer contactor, for example, by compressing the pogo pins located on the bottom of the connector 210. Additionally, the cap 204 may comprise a heat sink 216 enabling heat transfer from the testing stack 200 to the outside environment during use.

The testing stack 200 also comprises two circuit boards (further described below in connection with FIG. 7). Each circuit board comprises a center portion 217 connected to a set of four vertical portions or flex circuits 218 that extend vertically along the sides of the testing stack 200 from the top to the bottom of the housing 202 (or vice versa), with one portion disposed along each side of the testing stack 200 for connection to each of the test cards within the housing 202. One center portion is located at the top of the testing stack 200, and the other center portion is located at the bottom of the testing stack 200. It should be appreciated that each circuit board, including its respective center and vertical portions, enables electrical and data communication between the testing stack 200, including each of the test cards and the wafer contactor and, thereby, the wafer to be tested, as well as and other equipment, devices, or structures in the system 100 for testing semiconductor devices. As shown in FIG. 2, on each side of the testing stack 200, the leftmost vertical portions 218 or flex circuit are electrically connected to a center portion 217 located at the bottom of the testing stack 200, whereas the rightmost vertical portions 218 or flex circuit are electrically connected to a center portion 217 located at the top of the testing stack 200. In one embodiment, one circuit board with its center portion 217 located at the top of the test stack 200 handles data input/output (I/O) or signal transfer from the test boards to and from a server or personal computer. Accordingly, it should be appreciated that an electrical connection for such data I/O can be made from this center portion 217 to whatever additional electronics is necessary to drive the testing stack 200 and collect test data from the testing stack 200 using any means known in the art. In one embodiment, one circuit board with its center portion 217 located at the bottom of the test stack 200 handles data I/O or signal transfer from the test boards to and from the connector 210 and the wafer being tested. It should be appreciated that one circuit board, including one center portion and either one flex circuit board for each of two sides of the testing stack 200 or four flex circuit boards for each of the four sides of the testing stack 200, could be used instead of two circuit boards. In this embodiment, the center portion would be located at the top of the testing stack to allow for data I/O or signal transfer via cables from the test boards to and from a server or personal computer. In addition, a frame 220 is disposed around the center portions 217 of the circuit boards. One frame 220 is disposed beneath the center portion 217 of the circuit board located at the bottom of the testing stack 200, and a second frame 220 is disposed on top of the center portion 217 of the circuit board located on the top of the testing stack 200.

Figure 3:
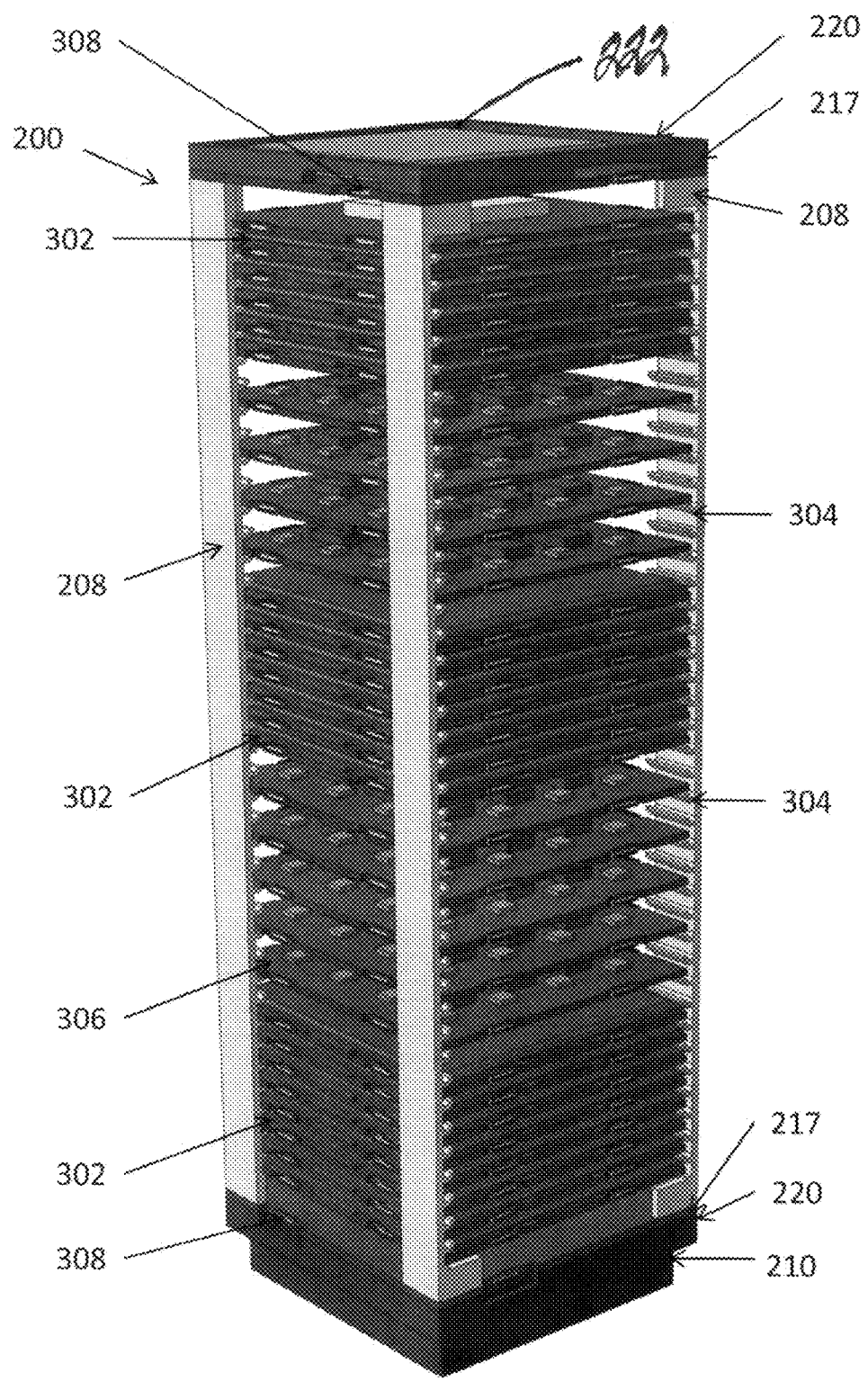
FIG. 3 illustrates a side perspective view of the testing stack of FIG. 2 with test boards installed according to one embodiment of the present invention.

FIG. 3 illustrates a side perspective view of the testing stack of FIG. 2 with test boards installed according to one embodiment of the present invention. The testing stack 200 is shown in FIG. 3 without the flex circuits that are vertically disposed along the sides of the testing stack 200 (see the flex circuits 218 in FIG. 2) to illustrate the location of test boards 302 within the testing stack 200. As shown, the testing stack 200 can hold a series of test boards 302 that are each oriented in a horizontal position relative to the top and bottom of the testing stack 200 but that are stacked on top of one another with some space between them such that the test boards 302 form a vertical stack of test boards. Shelves 304 are attached to the four corner portions 208 in equally spaced increments for holding the test boards 302. It should be appreciated that the shelves 304 may be any geometry or size that is sufficient to hold the test boards 302. In addition, it should be appreciated that the four corner portions 208 are sized to provide sufficient openings on the sides of the testing stack 200 to allow individual test boards 302 to be inserted and removed and replace or substituted with another test board. This design and ability to remove and replace individual test boards provides the ability to address any data I/O issues that may arise without having to replace an entire I/O board as would otherwise have to be done. Also, electrical ports 306 on each test board 302 are shown. FIG. 3 also illustrates the center portions 217 of the circuit boards to which the vertical flex circuits 218 are attached, as well as corresponding electrical ports 308 on each of the center portions 217. In addition, the frames 220 are also shown. A printed circuit board 222 is also disposed on top of the center portion 217 of the circuit board located at the top of the testing stack 200, which contains the test engines and testing stack controller.

Figure 4:
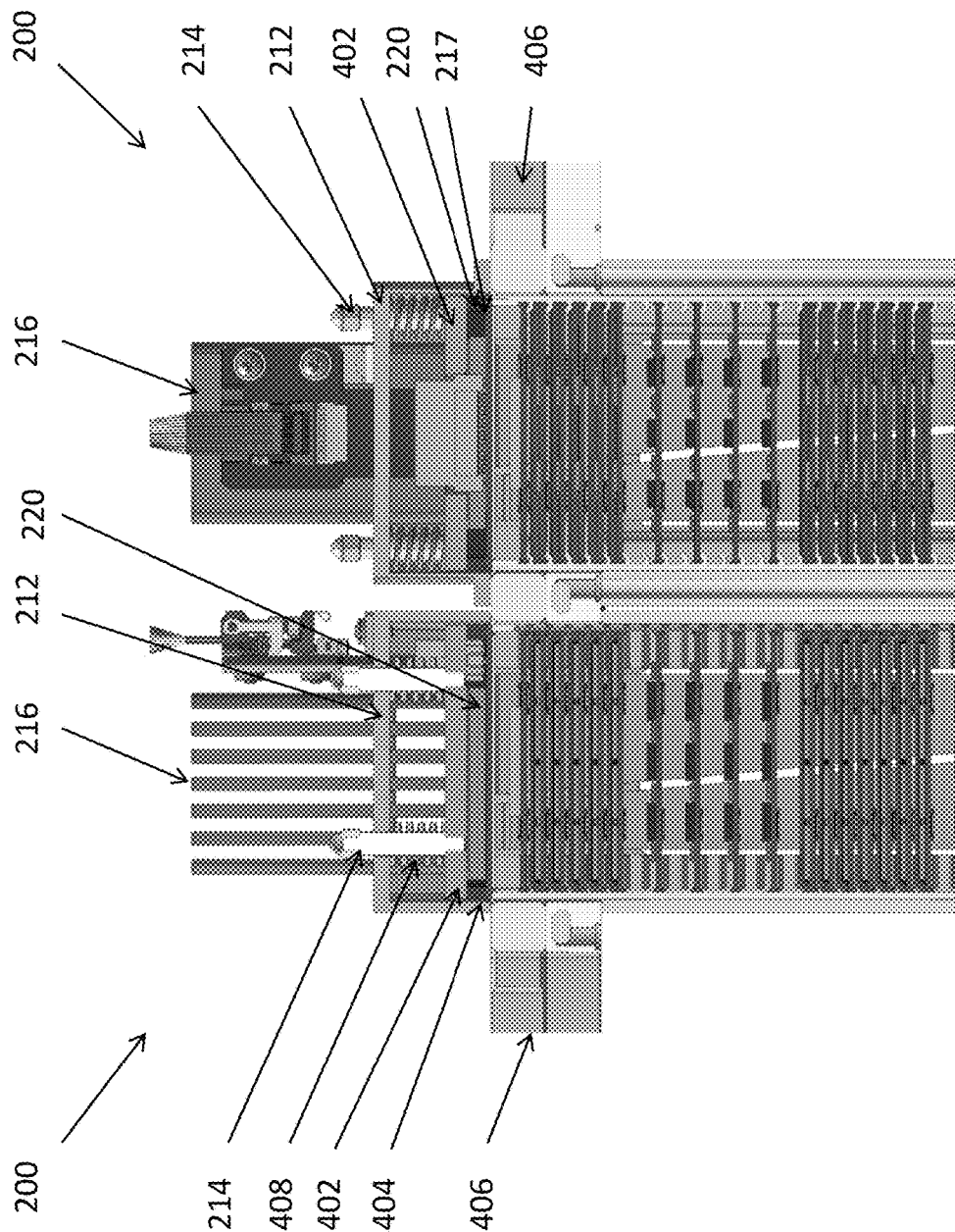
FIG. 4A illustrates a cross-sectional view of the top portion of the testing stack taken along line A-A of FIG. 2.
FIG. 4B illustrates a cross-sectional view of the top portion of the testing stack taken along line B-B of FIG. 2.

FIG. 4A illustrates a cross-sectional view of the top portion of the testing stack taken along line A-A of FIG. 2. As shown, a heat sink 216 is disposed on top of the testing stack 200. The heat sink 216 has a bottom base 402 that resides on top of the frame 220 that is disposed over the center portion 217 of the circuit board. (It should be appreciated that the vertical portions or flex circuits 218 are not shown in FIG. 4A.) The bottom base 402 of the heat sink 216 may cover the entire surface area of the top of the testing stack 200 or the frame 220. The cap 212 is disposed on top of the testing stack 200 and has spring-loaded screws 214 that secure the cap 212 to the bottom base 402 of the heat sink 216. The cap has a bottom extension 404 that rests on the surface of a plate 406 used to hold the upper portion of the testing stack 200. This plate 406 is described further below in connection with FIG. 11.

The spring-loaded screws 214 include a screw 214 and a spring 408 disposed around the shaft of the screw 214. The screw 214 traverses from the top of the cap 212 and is screwed into the bottom base 402 of the heat sink 216. The spring 408 is located under the cap 212 and above the bottom base 402 of the heat sink 216. Accordingly, by tightening the screws 214, the springs 408 will exert a downward force on the bottom base 402 of the heat sink 216, thereby forcing the testing stack 200 in a downward direction. This force is used to secure the physical and electrical connection of the connector 210 located at the bottom of the testing stack 200 to the top side of the wafer contactor.

FIG. 4B illustrates a cross-sectional view of the top portion of the testing stack taken along line B-B of FIG. 2. Basically, the same components described in connection with FIG. 4A are illustrated in FIG. 4B. (It should be appreciated that the vertical portions or flex circuits 218 are not shown in FIG. 4B.) However, it should be appreciated, as described below in connection with FIGS. 11 and 12, that, in use, multiple testing stacks 200 will be disposed adjacent to one another, for example in a matrix. In some embodiments, each adjacent testing stack 200 may be rotated 90° about its center vertical axis such that the orientation of one testing stack next to an adjacent testing stack would be as shown collectively in FIGS. 4A and 4B. Accordingly, it should be appreciated that the plate 406 used to hold the upper portions of the testing stacks 200, will have a corresponding matrix of holds through which each testing stack 200 passes and in which each testing stack 200 is held.

Figure 5:
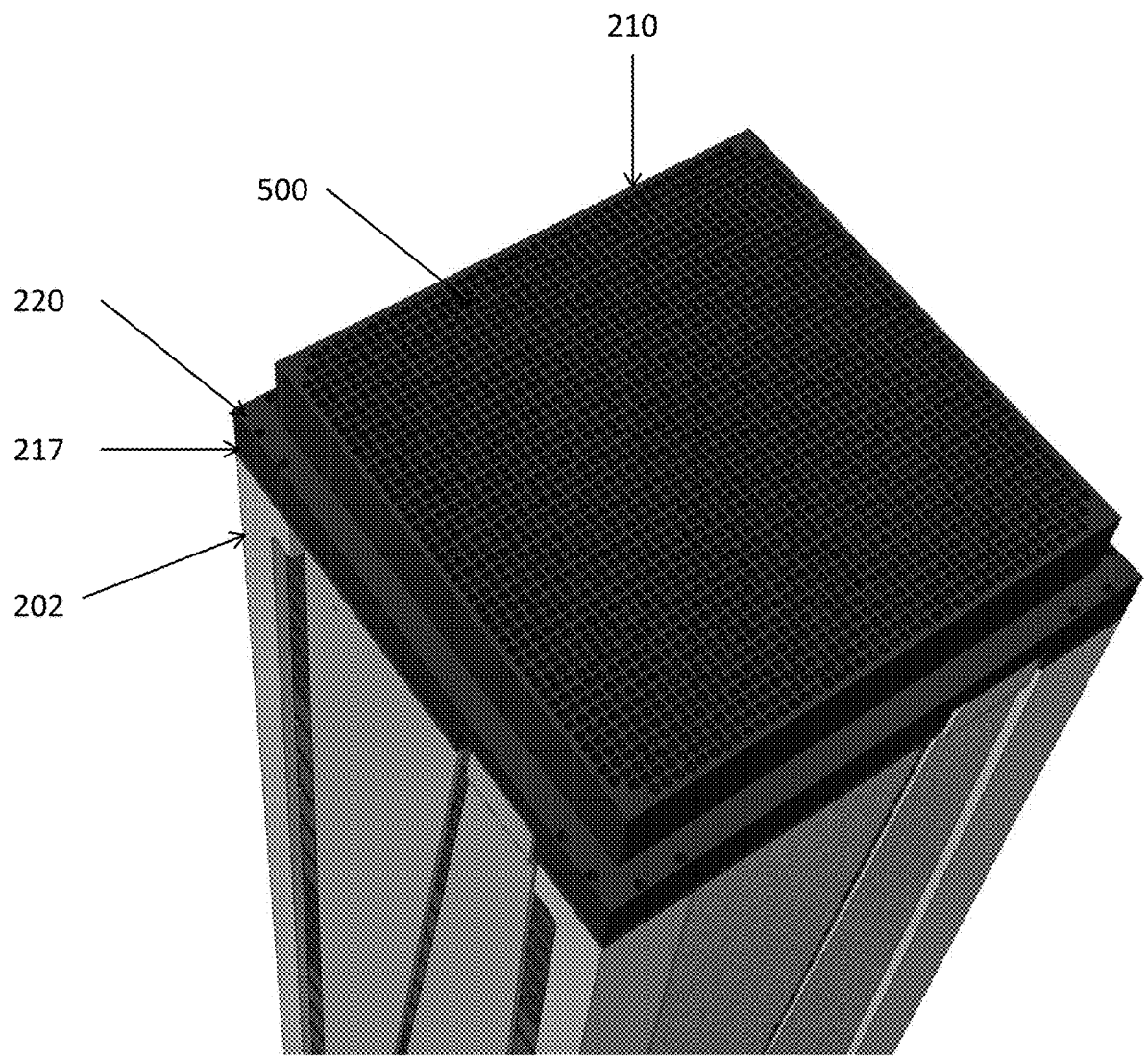
FIG. 5 illustrates a partial bottom perspective view of the testing stack of FIG. 2 according to one embodiment of the present invention.

FIG. 5 illustrates a partial bottom perspective view of the testing stack of FIG. 2 according to one embodiment of the present invention. As described previously, the testing stack 200 has an electrical connector 210 located on a bottom side of the housing 202. The connector 210 is configured to physically and electrically connect to a top side of a wafer contactor through the use physical structures 500, including, for example, pogo pins, or other structures known to one of skill in the art to enable a physical and electrical or data connection to the wafer contactor. It should be appreciated that this allows the testing stack to be spring-loaded against the wafer contactor without the use of a typical probe card.

Figure 6:
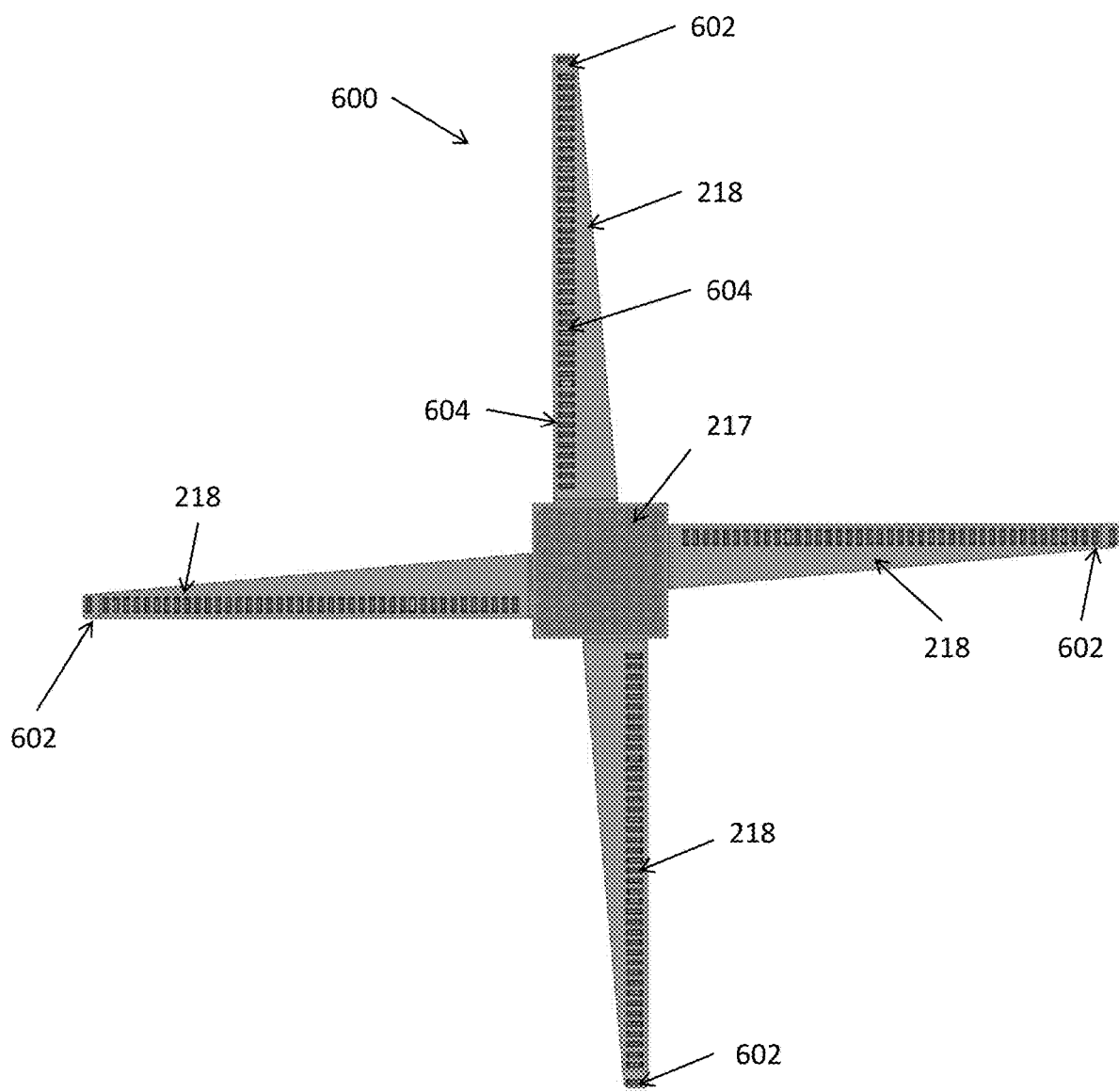
FIG. 6 illustrates a top view of a circuit board for a testing stack for testing semiconductor devices according to one embodiment of the present invention.

FIG. 6 illustrates a top view of a circuit board for a testing stack for testing semiconductor devices according to one embodiment of the present invention. As described in connection with FIG. 2, the testing stack 200 utilizes two printed circuit boards to facilitate data I/O between the test cards 302 held by the testing stack 200 and the wafer contactor and the wafer to be tested, as well as between the test cards 302 and other equipment, devices, or structures in the system 100 for testing semiconductor devices. FIG. 6 illustrates one of these circuit boards 600, which includes a center portion 217 connected to a set of four vertical portions or flex circuits 218 that, in use, extend from the top to the bottom of the housing 202, with one portion disposed along each side of the testing stack 200 for connection to each of the test cards within the housing 202. It should be appreciated that FIG. 6 illustrates this circuit board 600 with the flex circuits 218 being laid flat in the same plane as the center portion 217. At the end of each flex circuit 218, there is a connector 602 that electrically connects to the center portion 217 of the second circuit board being used in conjunction with the testing stack 200. For example, one circuit board 600 has a center portion 217 located at the top of the testing stack 200. Its connectors 602 would then connect with the center portion 217 of the circuit board 600 located at the bottom of the testing stack 200. These connections with the opposite circuit board are shown in FIG. 2. In addition, each flex circuit 218 has multiple connectors 604 that electrically connect to a corresponding test card 302 held within the housing 202 of a given testing stack 200.

Figure 7:
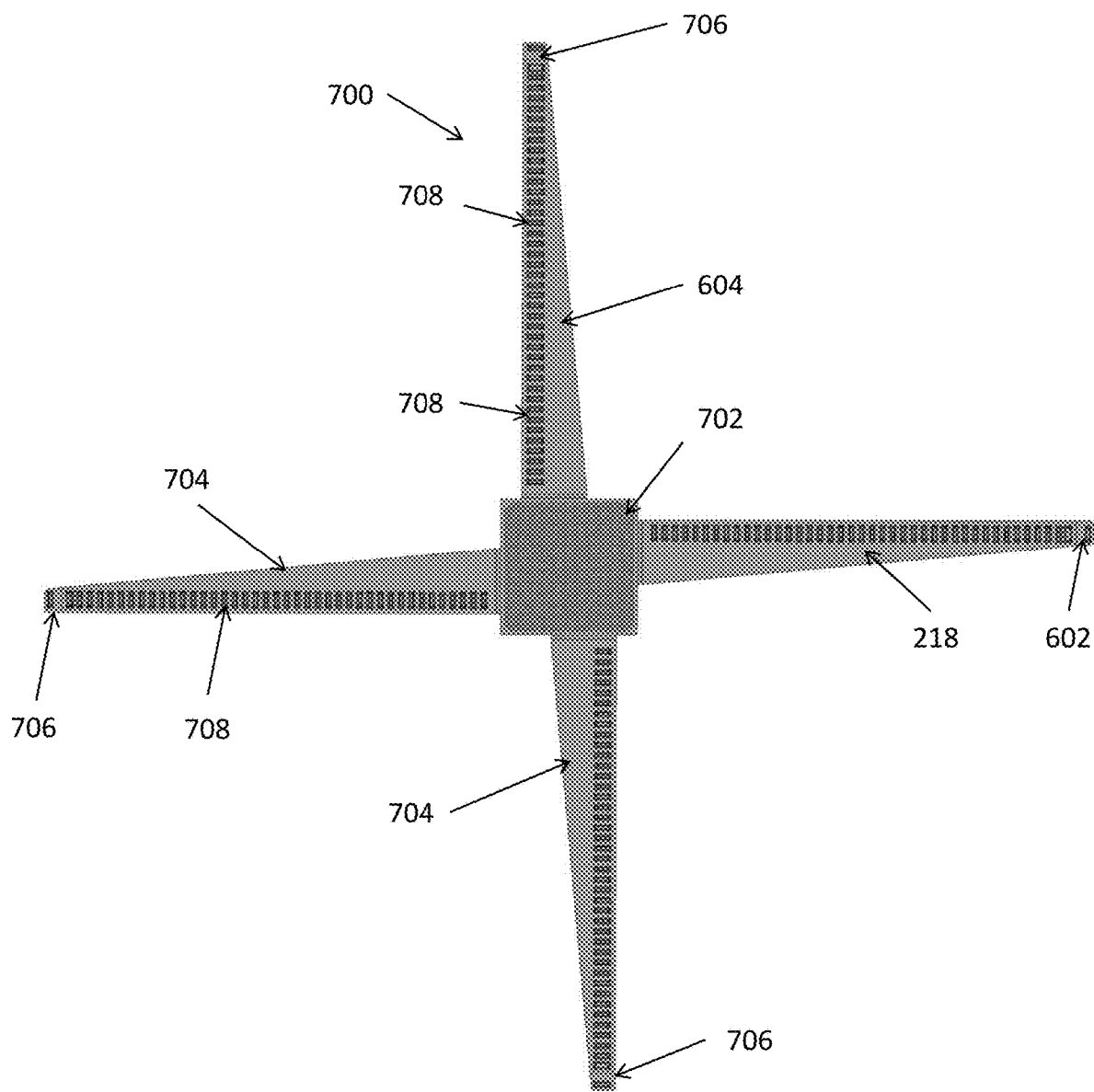
FIG. 7 illustrates a top view of another circuit board for a testing stack for testing semiconductor devices according to one embodiment of the present invention.

FIG. 7 illustrates a top view of another circuit board for a testing stack for testing semiconductor devices according to one embodiment of the present invention. Similar to FIG. 6, the circuit board 700 includes a center portion 702 connected to a set of four vertical portions or flex circuits 704 that, in use, extend from the bottom to the top of the housing 202, with one portion disposed along each side of the testing stack 200 for connection to each of the test cards within the housing 202. Therefore, it should be appreciated that the circuit board shown in FIG. 7 is presented as the counterpart to the circuit board shown in FIG. 6. In other words, the circuit board shown in FIG. 6 may, for example, be used as the circuit board having a center portion 217 that is disposed on the top of the testing stack 200 and the circuit board shown in FIG. 7 may then be used as the corresponding circuit board having a center portion 702 that is disposed on the bottom of the testing stack 200. Accordingly, when used together, the corresponding triangular shapes of the vertical portions of each flex circuit 604, 704 would fit next to and spatially accommodate each other on each side of the testing stack 200. It should be appreciated that FIG. 7 illustrates this circuit board 700 with the flex circuits 704 being laid flat in the same plane as the center portion 702.

At the end of each flex circuit 704, there is a connector 706 that electrically connects to the center portion 702 of a similar circuit board 700 being used in conjunction with the testing stack 200. For example, one circuit board 700 has a center portion 702 located at the bottom of the testing stack 200. Its connectors 706 would then connect with the center portion 702 of a second circuit board 700 located at the top of the testing stack 200. In addition, each flex circuit 704 has multiple connectors 708 that electrically connect to a corresponding test card 302 held within the housing 202 of a given testing stack 200. It should also be appreciated that the use of flex circuits eliminates the need for four connectors that would otherwise be used on each of the four sides of the center portion of the circuit board for connection to a connector or test engine at the top of the testing stack (such as the connector 910 in FIG. 9) and to the pogo pins of the electrical connector at the bottom of the testing stack. However, it should be appreciated that the circuit boards can be connected using interconnect printed circuit boards on each side to connect the circuit boards to the test engine at the top of the testing stack and to the pogo pins of the electrical connector at the bottom of the testing stack.

It should be appreciated that in some embodiments, the circuit board, including the center portion and the flex circuit portions, may be designed in various configurations. For example, multiple circuit boards may be used on both the top and bottom of the testing stack. In one embodiment, two circuit boards may be used on the top of the testing stack and two circuit boards may be used on the bottom of the testing stack. In this case, the center portion of each circuit board would be one-half of the area of the top or bottom of the testing stack such that two circuit boards together would cover the total area on top or bottom of the testing stack. Each circuit board would have two flex circuits extending from the top to the bottom or the bottom to the top of the testing stack on two sides. Accordingly, with the center portions of two circuit boards disposed on the top of the testing stack, there would be a total of four flex circuits, one for each side of the testing stack, extending from the top to the bottom of the testing stack. Similarly, another two circuit boards would be used on the bottom of the testing stack providing a total of four flex circuits, one for each side of the testing stack extending from the bottom to the top of the testing stack.

In another embodiment, four circuit boards may be used on the top of the testing stack and four circuit boards may be used on the bottom of the testing stack. In this case, the center portion of each circuit board would be one-quarter of the area of the top or bottom of the testing stack such that four circuit boards together would cover the total area on top or bottom of the testing stack. Each circuit board would have one flex circuit extending from the top to the bottom or the bottom to the top of the testing stack on one side. Accordingly, with the center portions of four circuit boards disposed on the top of the testing stack, there would be a total of four flex circuits, one for each side of the testing stack, extending from the top to the bottom of the testing stack. Similarly, another four circuit boards would be used on the bottom of the testing stack providing a total of four flex circuits, one for each side of the testing stack, extending from the bottom to the top of the testing stack.

Figure 8:
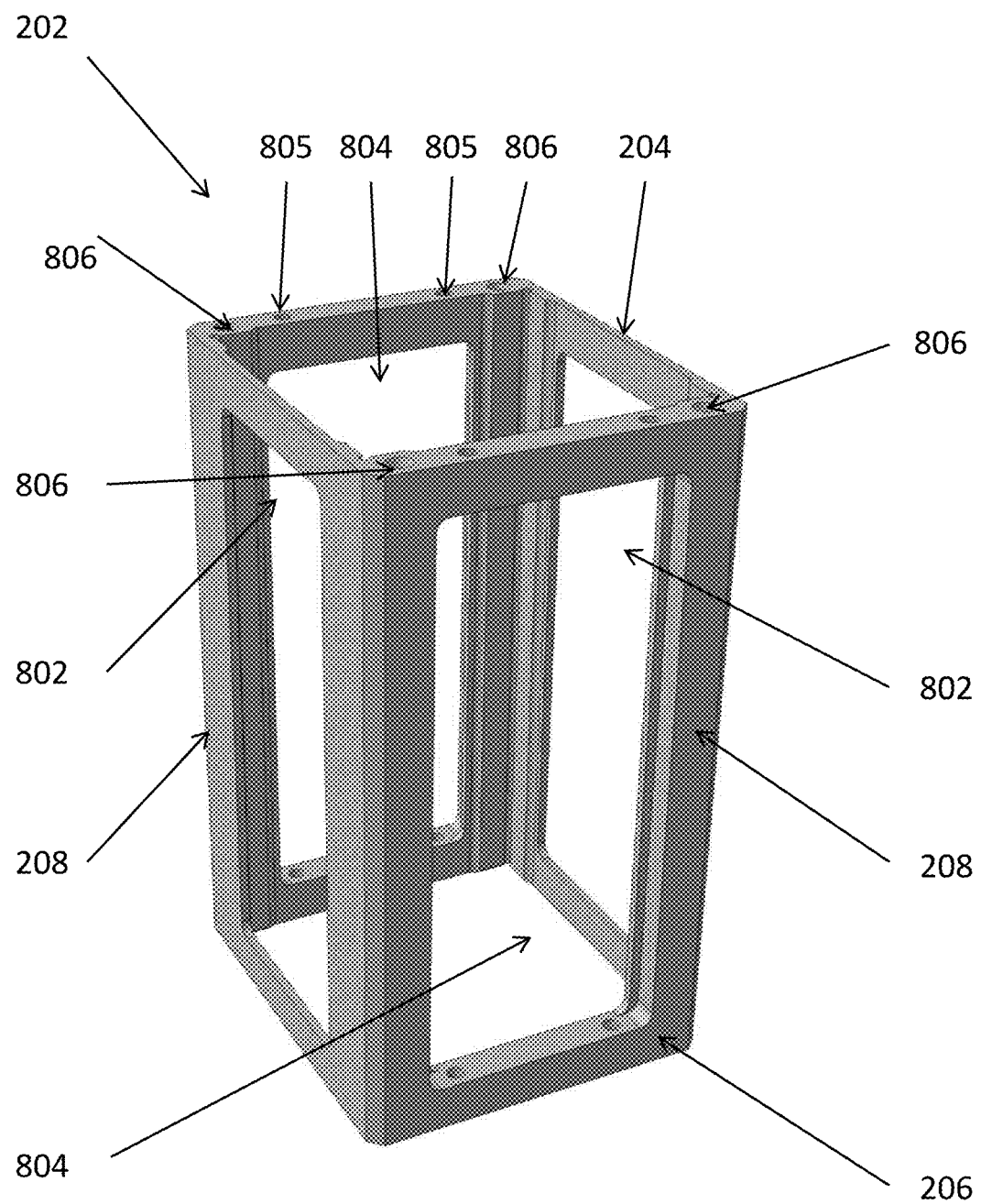
FIG. 8 illustrates a side perspective view of the housing of the testing stack of FIG. 2 according to one embodiment of the present invention.

FIG. 8 illustrates a side perspective view of the housing of the testing stack of FIG. 2 according to one embodiment of the present invention. As described above, the housing 202 is generally in the shape of a rectangular prism and includes a top frame 204 and a bottom frame 206 and four corner portions 208 that extend from the top to the bottom of the housing 202 at each corner. It should be appreciated that there are openings 802 on each side of the housing 202 and openings 804 on the top and bottom sides of the housing 202. In addition, the housing 202 includes fixing holes to 805 to assist in the attachment of the components attached to the top and bottom of the housing 202, such as the center portion 217 of the circuit boards. It should be appreciated that the housing 202 may be constructed in any manner known in the art and may be constructed from separate pieces, such as one piece for each side. The housing 202 may be constructed from any materials suitable for holding test cards. However, it should be appreciated that channels 806 extend from the top frame 204 through each corner portion 208 to the bottom frame 206. These channels 806, which may be cylindrical in shape, are used to pass a cooling fluid or coolant through the housing 202, specifically through each corner portion 208 from the top to the bottom or vice versa of the housing 202. The cooling aspect of the present invention is described further below in connection with FIG. 15. Accordingly, because the housing 202 is used to pass heat from the test cards to the cooling fluid, in some embodiments, the material from which the housing 202 is constructed may be a material that easily passes heat. For example, in some embodiments, the housing 202 may be made of any suitable material or materials, including, but not limited to, various metal alloys, such as copper.

Figure 9:
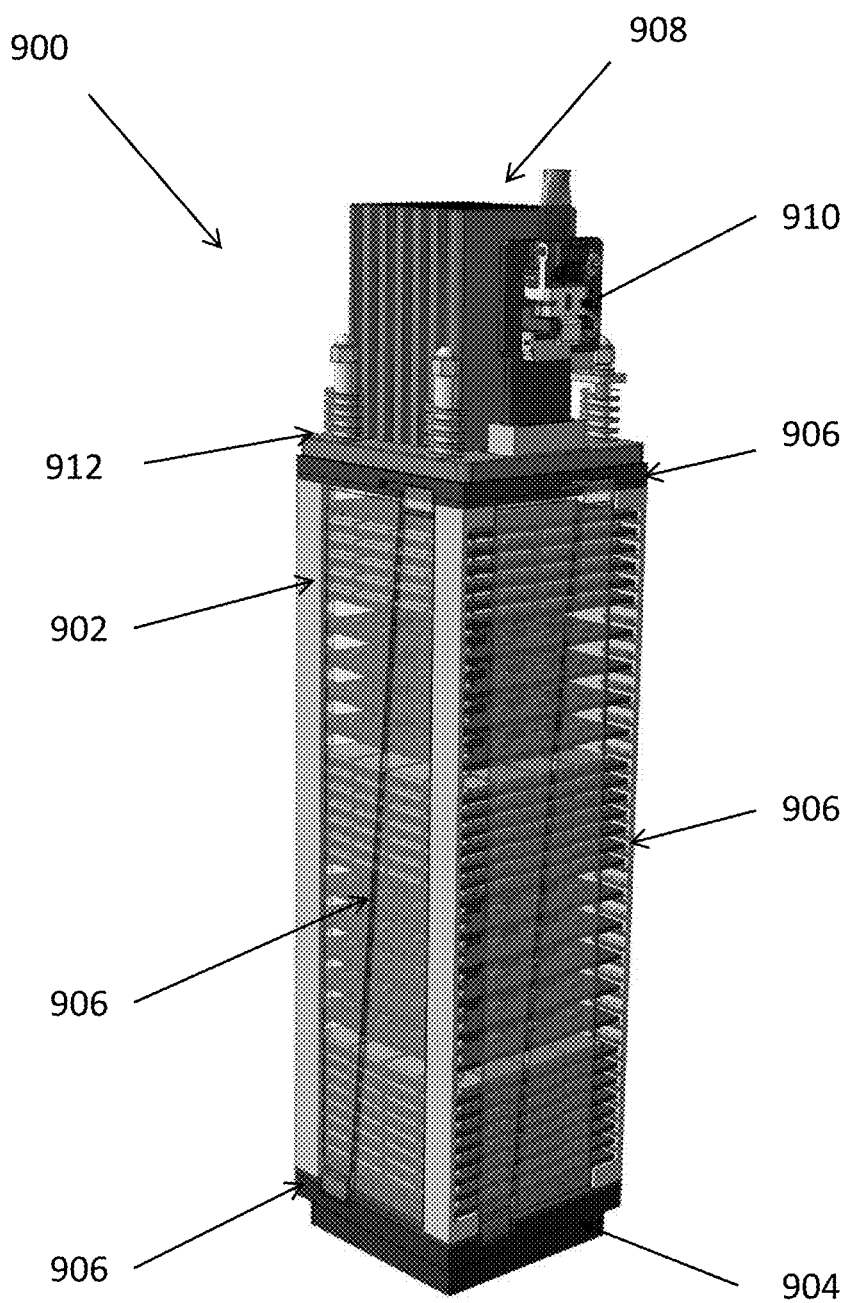
FIG. 9 illustrates a side perspective view of another testing stack for testing semiconductor devices according to one embodiment of the present invention.

FIG. 9 illustrates a side perspective view of another testing stack for testing semiconductor devices according to one embodiment of the present invention. The testing stack 900 shown is similar to the testing stack shown in FIGS. 2 and 3. The testing stack 900 contains a housing 902, an electrical connector 904 on the bottom side, a cap (not shown but similar to the cap 212 shown in FIG. 2), two circuit boards 906, which may be the circuit boards described in connection with FIGS. 6 and 7, and a heat sink 908. It should be appreciated that the description provided above for each of the corresponding components for use in connection with the testing stack 200 shown in FIG. 2, applies to these components as well. The testing stack 900 also has a connector 910 for electrically connecting the top center portion of the circuit board 906 to cables (not shown) that would extend to other equipment, devices, or structures in the system 100 for testing semiconductor devices. The connector 910 passes through an opening in the base 912 of the heat sink 908 and electrically connects to the underlying center portion of the circuit board 906 on the top of the housing 902. At its opposite end, the connector would connect to electrical data cables to permit data transfer to and from the testing stack 902, specifically, the test cards and the wafer being testing (via the connector 904 and the circuit board 906 on the bottom of the housing 902), to and from other equipment, devices, or structures in the system 100. In one embodiment, the connector 901 may be an optical test engine for a PCIe over fiber connection to a host computer. In this case, within a few inches from the wafer being tested, data signals may be converted from electrical signals to light signals for a lossless transmission of up to 100 meters.

Figure 10:
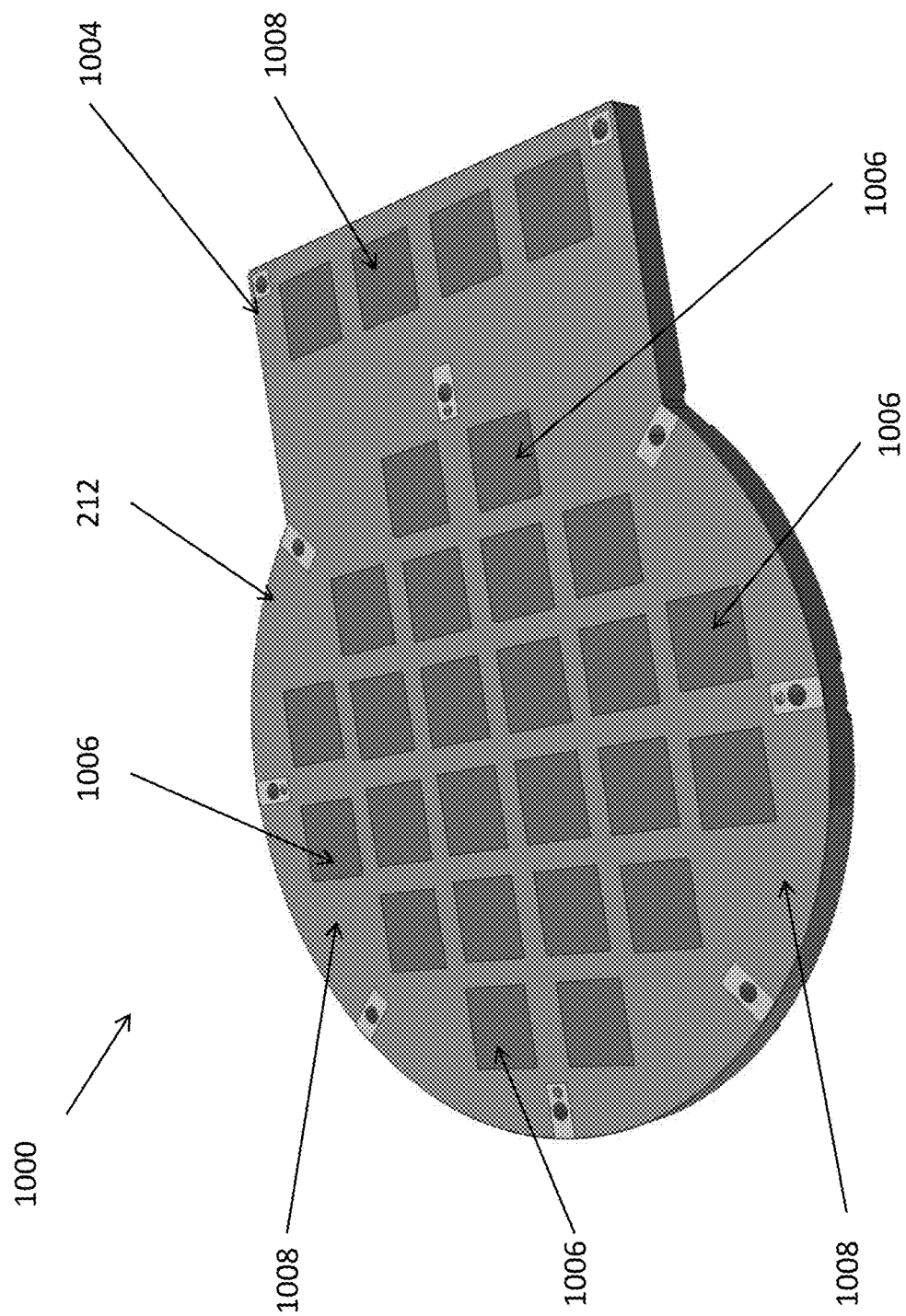
FIG. 10 illustrates a top perspective view of a wafer contactor according to one embodiment of the present invention.

FIG. 10 illustrates a top perspective view of a wafer contactor according to one embodiment of the present invention. The wafer contactor 1000 is disposed between one or more testing stacks 200, which are mounted on a top surface of the wafer contactor 1000, and the surface of the wafer to be tested. As shown, the wafer contactor 1000 is a circular plate 1002 with an extension portion 1004 on one side. In some embodiments, the wafer contactor 1000 is a ceramic circular plate, which in some embodiments may be constructed by methods known in the art or by using a 3-dimensional ceramic and metal printer. In some embodiments, the wafer contactor 1000 is sealed about its perimeter. The top side of the wafer contactor 1000 is shown in FIG. 10 and contains pads 1006 for receipt of a corresponding testing stack, such as the testing stacks described in connection with FIGS. 2, 3, and 9. Specifically, the electrical connector 210, 904 located on the bottom side of the testing stack 200, 900 is mounted on a corresponding pad 1006. As shown, the wafer contactor 1000 can accommodate up to 24 testing stacks. It should be appreciated, however, that wafer contactors can be designed to accommodate more or less testing stacks. In some embodiments, the pads 1006 or gold pads. The pads 1006 are electrically connected to the electrical connector 210, 904 on the bottom of each corresponding testing stack through the use of physical structures, including, for example, pogo pins, or other structures known to one of skill in the art that enable a physical connection to the wafer contactor 1000. In addition, as described above in connection with FIG. 4A, the electrical connector 210, 904 is further secured to the wafer contactor 1000 through the use of physical force exerted in a downward direction (i.e., vertically downward from the testing stack to the wafer contactor) through the use of the spring-loaded screws 214.

The wafer contactor 1000 also includes multiple power I/O contacts 1008 located within the extension portion 1004 and also uniformly located around the perimeter of the wafer contactor 1000. The power I/O contacts 1008 are used to deliver power to the wafer contactor 1000, as well as any other equipment, devices, or structures attached to the wafer contactor 1000, including certain areas or die pads of the wafer to be tested. It should be appreciated that power connections of the type represented in FIG. 10 are well-known to a skilled artisan. The power I/O contacts 1008 may be connected to a power server board that supplies power to the power I/O contacts 1008.

It should be appreciated that during use the bottom side of the wafer contactor 1000 will be in physical and electrical contact with the wafer to be tested. Accordingly, there is circuity or gold traces that pass from each of the gold pads 1006 through the body of the wafer contactor 1000 to the bottom side of the wafer contactor 1000 where such gold traces would contact the area or die pad of the wafer to be tested. In some embodiments, micro-mechanical-electrical systems (MEMs), such as MEMs-type or tiny springs, may be used for the connection between the bottom side of the wafer contactor 1000, specifically those areas beneath each of the gold pads 1006, and the wafer to be tested. The fact that the testing stack containing various test cards or pin driver boards is physically pressed directly against the wafer contactor, with the bottom side of the wafer contactor 1000 being directly connected to the wafer to be tested, is an important aspect of the present invention because such a short distance between the test cards and the wafer provides numerous benefits as discussed above. It should be appreciated that some of the springs on the bottom side of the wafer contactor 1000 are routed to the power I/O contacts 1008 on a wafer to allow for the receipt of power by these springs that can be supplied to certain areas or die pads on the wafer to be tested. In some embodiments, power can be supplied to the power pins on the wafer contactor 1000 from the testing stacks test boards or pin driver cards, for example, in cases where the wafer or die being tested requires the maximum current that can be provided by the power pins, which may be useful as devices become faster and smaller and operate at lower power. It should be appreciated that in such cases, the power server board may not be necessary.

Figure 11:
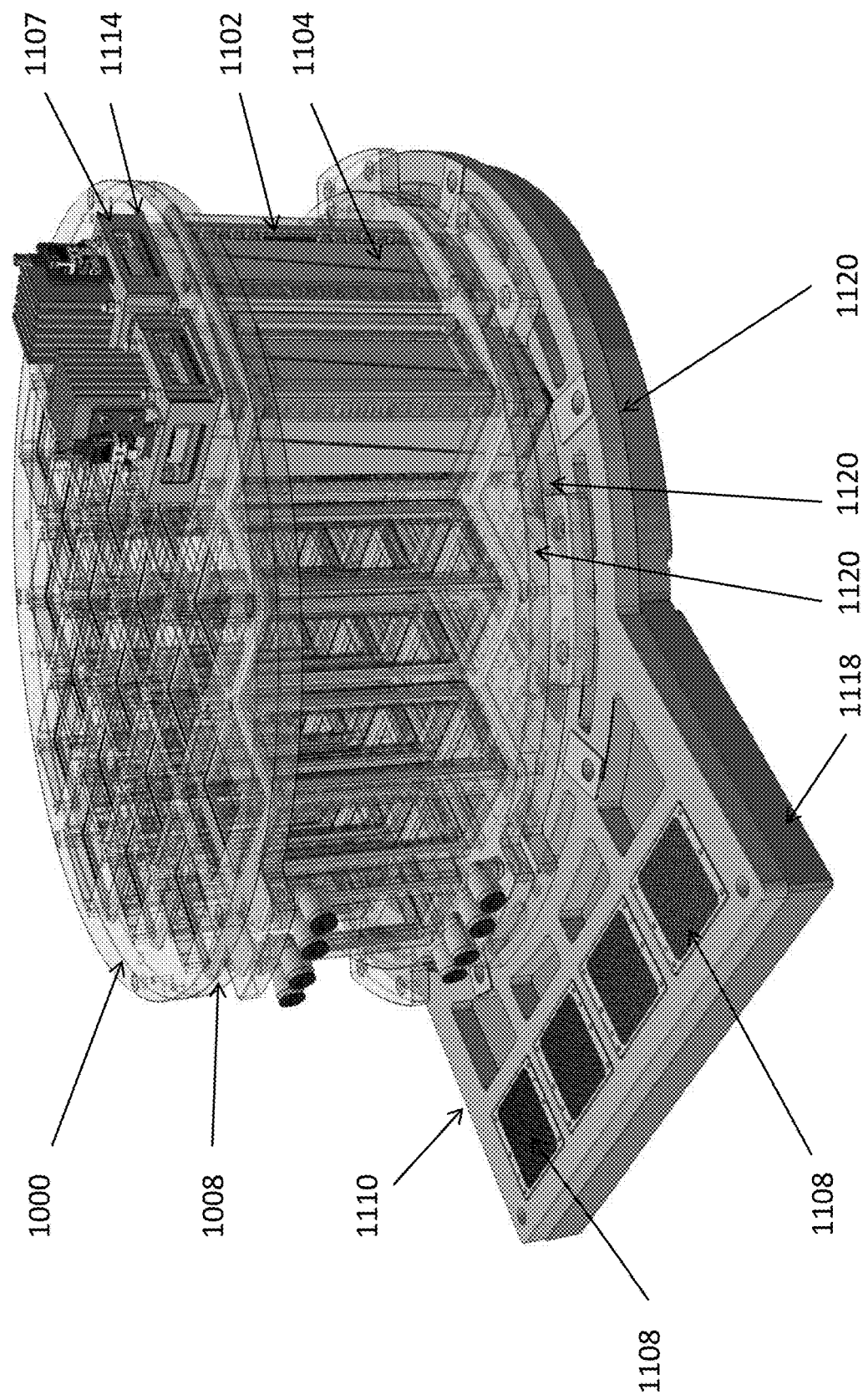
FIG. 11 is a side perspective view of testing stacks mounted on a wafer contactor according to one embodiment of the present invention.

FIG. 11 is a perspective side view of testing stacks mounted on a wafer contactor according to one embodiment of the present invention. As shown, two example testing stacks 1102, similar to those shown in FIG. 9 and with the circuit boards having the flex circuits 1104 as shown in FIG. 7, are mounted on top of a wafer contactor 1106, such as the wafer contactor 1000 described in connection with FIG. 10. Also shown are caps 1107 on each of the testing stacks 1102. It should be appreciated that the wafer contactor 1106 is different than the wafer contact shown in FIG. 10 in that the wafer contactor 1106 includes four power I/O contacts 1108 disposed in an extension portion 1109, versus the two shown on the wafer contactor 1000 in FIG. 10. The wafer contactor 1106 is mounted on a horizontal stiffener plate 1110 that serves to hold the wafer contactor 1106 in a fixed position. Also shown as transparent is plate 1112, which serves to hold the top of the testing stacks 1102. This plate 1112 is similar to the plate 406 described in connection with FIG. 4A on which a bottom extension 404 of the cap 212 rests. A bottom portion 1114 of the caps 1108 is shown resting on top of the plate 1112. A second plate 1116 includes piping for a cooling system that is described in connection with FIG. 15. A similar pair of plates 1118, 1120 are similarly disposed near the bottom of the testing stacks 1102 on top of the wafer contactor 1106, noting that this second pair of plates 1118, 1120 are stacked in the opposite order of the plates 112, 1116 near the top of the testing stacks 1102.

Figure 12:
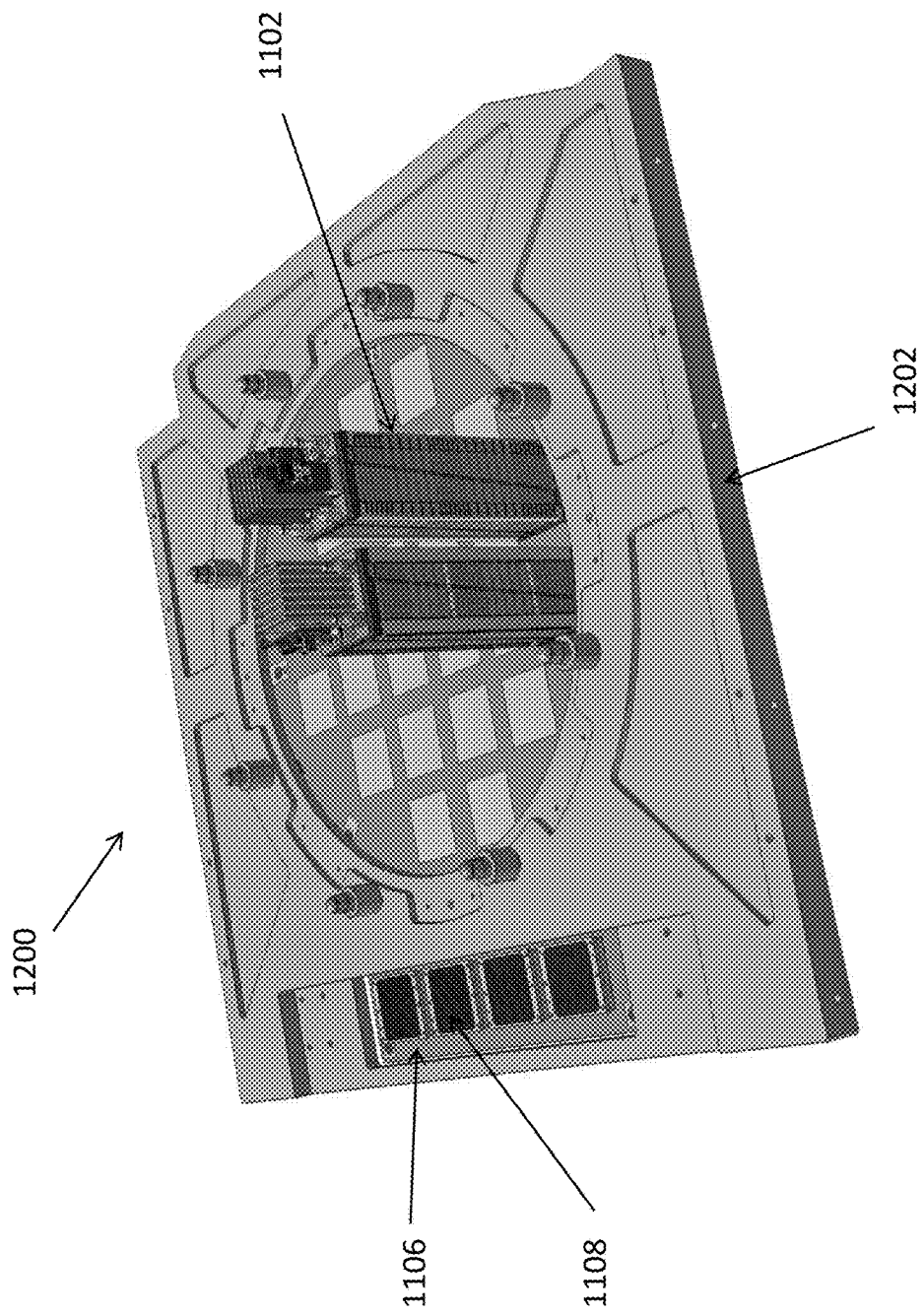
FIG. 12 illustrates a side perspective view of a wafer tester according to one embodiment of the present invention.

FIG. 12 illustrates a side perspective view of a wafer tester according to one embodiment of the present invention. The wafer tester 1200 is a complete module configured to test a given wafer by engaging the wafer below the wafer tester 1200, although it should be appreciated that the two pairs of plates 1112, 1116, 1118, 1120 located at the top and bottom of the testing stacks 1102 are not shown. FIG. 12 shows the same testing stacks 1102 mounted on a wafer contactor 1106 as shown in FIG. 11. As shown, a main plate 1202 is used to secure both the wafer contactor 1106 and the stiffener plate 1110 in place, which are both disposed below the main plate 1202. As shown, the power I/O contacts 1108 are still accessible and are ultimately connected to a power server board. It should be appreciated that the stiffener plate 1110 is connected with some amount of looseness to accommodate any thermal expansion during operation. It should also be appreciated that these three plates may be attached together using any means know in the art, including, for example, bolts and screws.

Figure 13:
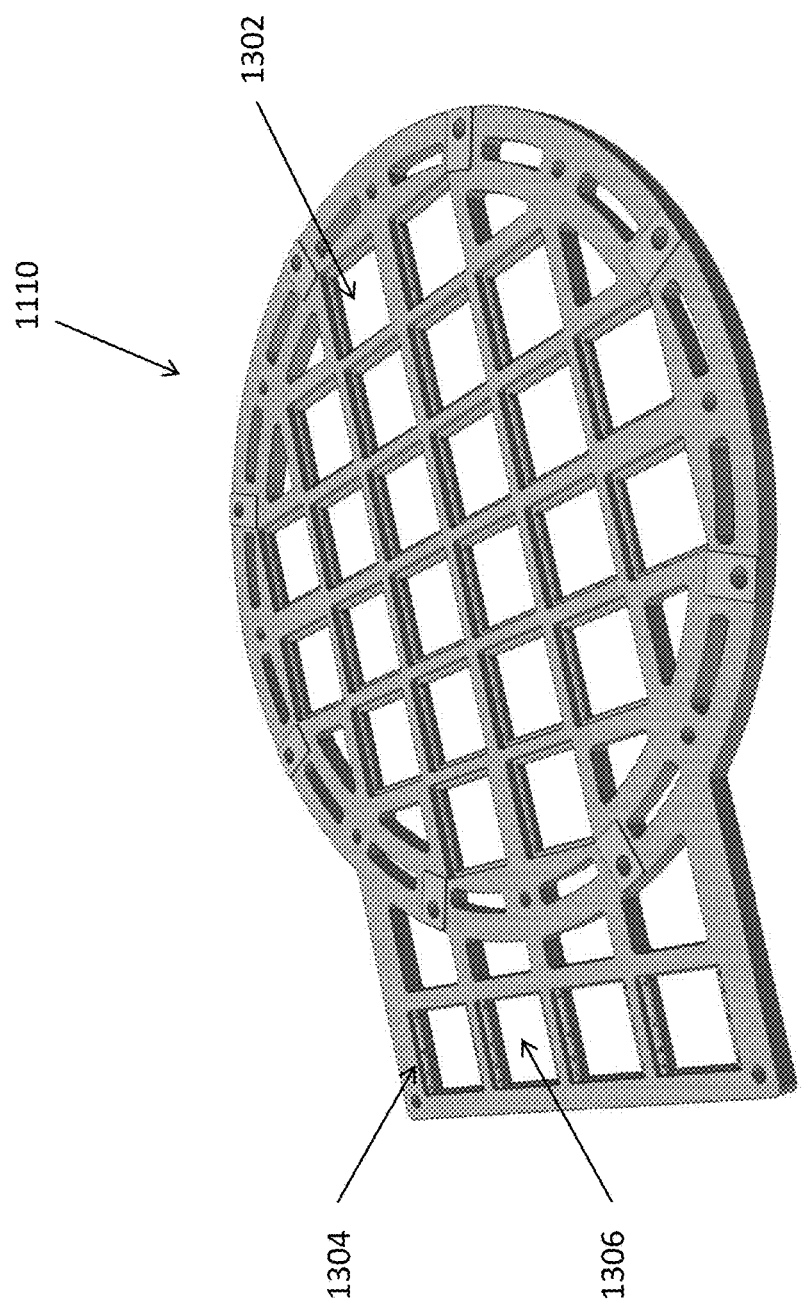
FIG. 13 illustrates a top perspective view of the stiffener of FIG. 11 according to one embodiment of the present invention.

FIG. 13 illustrates a top perspective view of the stiffener of FIG. 11 according to one embodiment of the present invention. The stiffener 1110 is a single circular plate having a matrix of square or rectangular openings 1302 that are dimensioned to allow a single testing stack to fit within and pass through a given opening 1302. Accordingly, the stiffener 1110 can in this embodiment accommodate 24 testing stacks. Similar to the wafer contactor 1000 in FIG. 10, the stiffener 1110 has a similar extension portion 1304 on one side. In some embodiments, the overall shape of the perimeter of the stiffener 1110 is the same or identical to that of the wafer contractor. As shown, the stiffener 1110 has the same shaped perimeter as the wafer contactor 1106 shown in FIG. 11. Accordingly, when the stiffener is placed on top of the wafer contactor, the shapes of the perimeters for each are the same. In this embodiment, the extension portion 1304 also has a series of openings 1306 designed to accommodate the power I/O contacts 1108 from the underlying wafer contactor 1106 as shown in FIG. 12. Accordingly, when the stiffener 1110 is disposed on top of the wafer contactor 1106 as shown in FIG. 12, the power I/O contacts 1108 are accessible from the top of the stiffener 1110. It should be appreciated that the stiffener 1110 is made of a stiff metal, such as steel, to ensure coplanarity with the underlying wafer contactor 1106.

Figure 14:
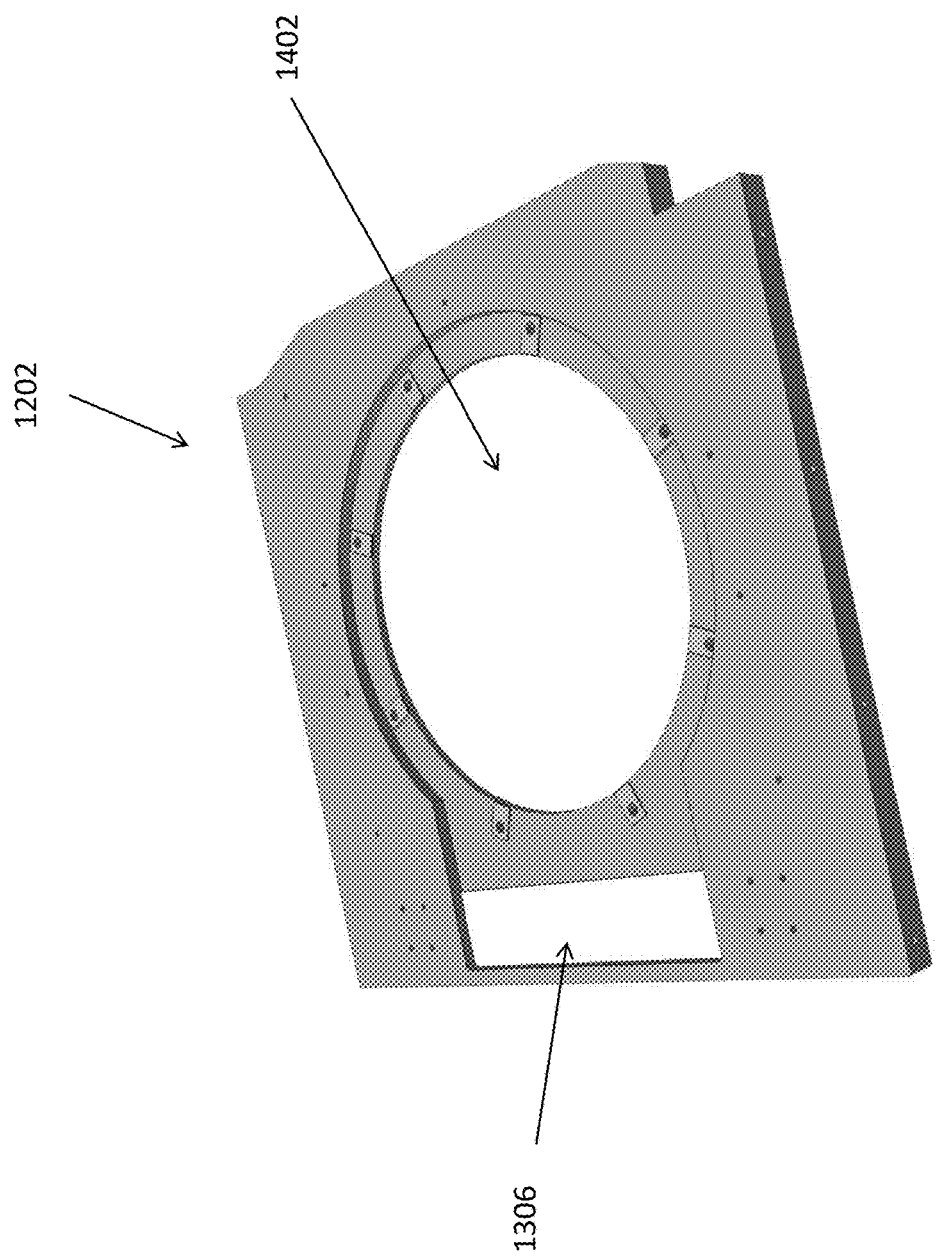
FIG. 14 illustrates a bottom perspective view of the main plate of FIG. 12.

FIG. 14 illustrates a bottom perspective view of the main plate of FIG. 12. The main plate 1202 is a single horizontal plate having a recess 1402 that is shaped for receipt of the stiffener and the wafer contactor, noting that the recess 1402 defines an opening in the main plate 1202 to allow the testing stacks to pass through the main plate 1202 and through the matrix of openings 1302 in the stiffener and to ultimately contact the surface, specifically the gold pads on the top surface of the wafer contactor. It should be appreciated that the main plate 1202 essentially holds the stiffener and the wafer contactor together. Since FIG. 12 is a bottom view, the stiffener would be disposed within this recess 1402 and would adjacent to the bottom of the main plate 1202. The wafer contactor would then be adjacent to the stiffener, which would then be the bottom layer of the three. The main plate 1202 also has an opening 1404 for receipt of the power I/O contacts on the wafer contactor. Accordingly, when viewed from the top, as in FIG. 12, the extension portion of the wafer contactor that holds the power I/O contacts 1108 are visible and accessible with the main plate 1202 in place. As described above, it should be appreciated that the stiffener is attached at its periphery to the main plate 1202 to allow for any thermal expansion during use, in particular, thermal expansion in a horizontal plane so as to maintain its coplanarity and essentially hold the wafer contactor in place.

Figure 15:
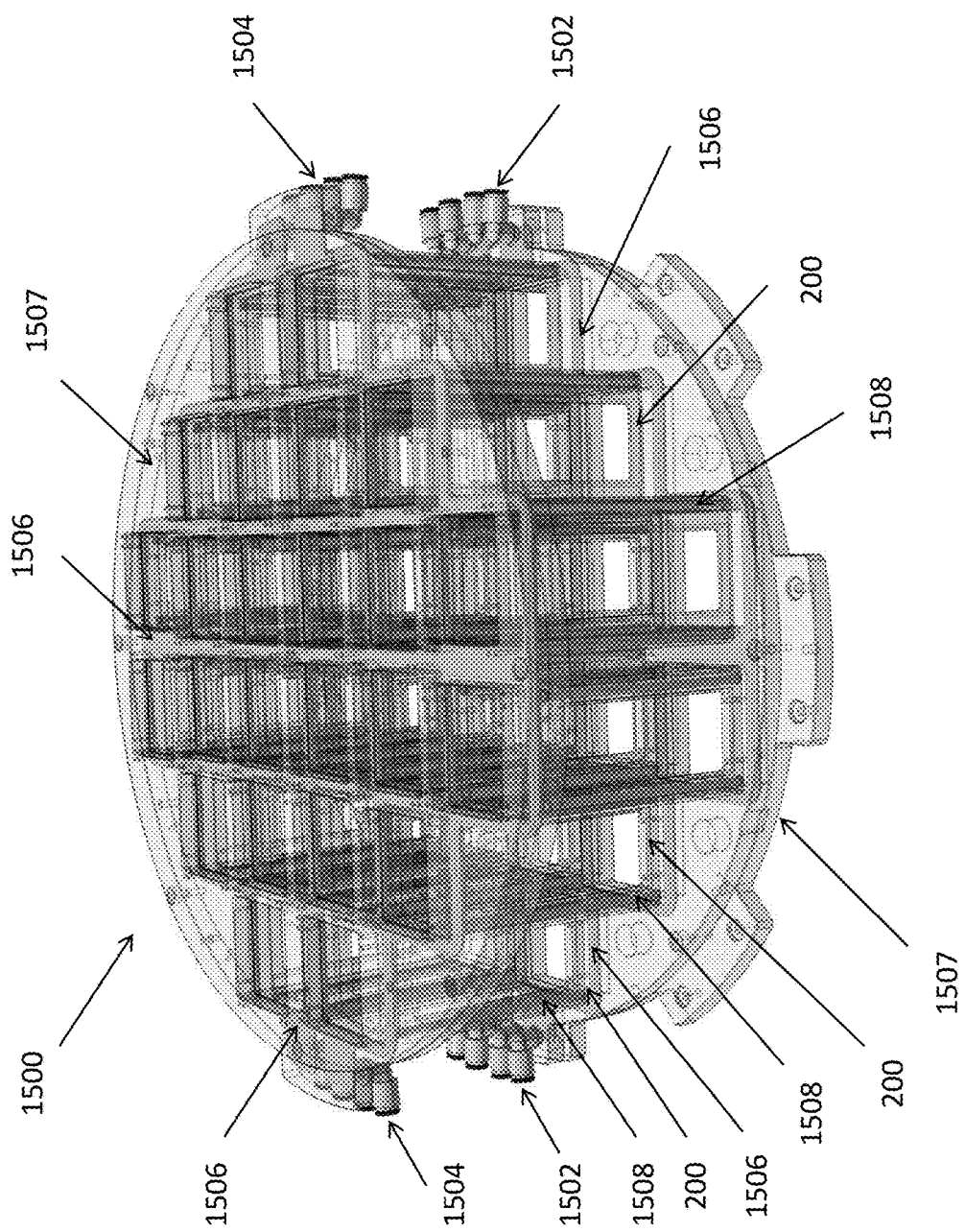
FIG. 15 illustrates a perspective view of a cooling system according to one embodiment of the present invention.

FIG. 15 illustrates a perspective view of a cooling system according to one embodiment of the invention. The cooling system 1500 includes a pair of input ports 1502 and a corresponding pair of output ports 1504 for delivering liquid coolant to and from the system 100. The cooling system 1500 also includes piping 1506 for carrying a liquid coolant that surrounds both the top and bottom perimeter of each testing stack 200 (shown in outline). The piping 1506 that surrounds the bottom perimeter of each testing stack 200 is fluidly connected to both sets of input ports 1502. The piping 1506 that surrounds the top perimeter of each testing stack 200 is fluidly connected to both sets of output ports 1504. The cooling system 1500 including the input ports 1502, the output ports 1504, and the piping 1406 are held in place by two plates 1507, one disposed on the top of the testing stacks 200 and one disposed on the bottom of the testing stacks 200. It should be appreciated that in one embodiment, the piping 1506 is disposed within the plates 1507. In one embodiment, the piping 1506 comprises channels formed integrally within the plates 1507.

In addition, each vertical corner portion 208 of each housing 202 for each testing stack 200 includes a channel 1508 located within the corner portion 208 itself that extends from the top to the bottom of the housing 202 and is fluidly connected to the piping 1506 such that it carries the liquid coolant from the piping 1506 that surrounds the bottom perimeter of each testing stack 200 to the piping 1506 that surrounds the top perimeter of each testing stack 200. Accordingly, coolant is pumped via an external pump (not shown) into one or more of the input ports 1502 and passes through the piping 1506 disposed around the bottom of the testing stacks, through the channels 1508 in each of the corner portions 208 of each housing 202 to the piping 1506 that surrounds the top perimeter each testing stack 200, and to one or more of the output ports 1504. The coolant may then be recycled through a heat exchanger (not shown) to remove the heat and cool the coolant before pumping back to the system 100. Accordingly, it should be appreciated that the cooling system 1500 provides coolant to the entire perimeter of each testing stack 200 and serves to dissipate heat during use of the system 100. The coolant may be any fluid, and in one embodiment may be water.

Figure 16:
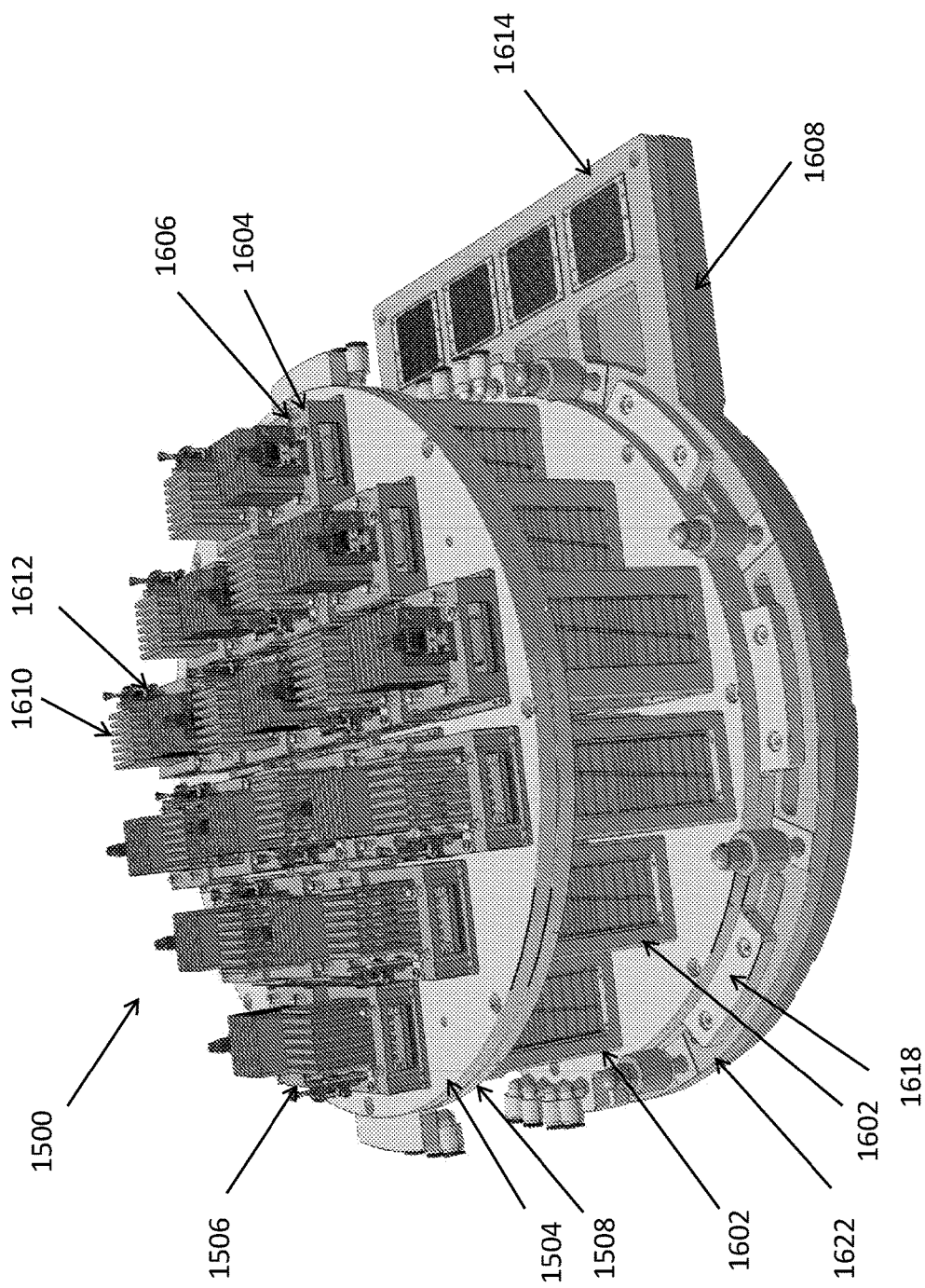
FIG. 16 illustrates a side perspective view of a wafer tester according to one embodiment of the present invention.

FIG. 16 illustrates a side perspective view of a wafer tester according to one embodiment of the present invention. The wafer tester 1600 is a complete module configured to test a given wafer by engaging the wafer below the wafer tester 1600. The wafer tester 1600 includes a plurality of testing stacks 1602, which may be of the type, and may include any of the features, described in connection with FIGS. 2-9. As shown, each testing stack 1602 has a cap 1604 with spring-loaded screws 1606 for securing each testing stack 1602 to the wafer contactor 1608. Each testing stack 1602 also has a heat sink 1610 located on its top and a connector 1612 for electrically connecting the test boards or pin driver cards held within the testing stacks 1602 to cables (not shown) to permit data I/O from the test boards to and from other devices, such as one or more host computers. These connectors 1612 may be the same as or similar to the connector 910 described in connection with FIG. 9. It should be appreciated that each testing stack 1602 is rotated about its center vertical axis by 90° relative to an adjacent testing stack 1602.

The wafer tester 1600 also includes a stiffener 1614, such as the stiffener 1110 described in connection with FIGS. 11-13, which is shown on top of the wafer connector 1608. Also shown are plates 1616, 1618 located near the top and bottom of the testing stacks 1602, respectively, and are similar or identical to the plates 1112, 1120 described above in connection with FIG. 11. These plates 1616, 1618 have cut-outs to hold the testing stacks 1602. In particular, the plate 1616 located near the top of the testing stacks 1602 has an upper surface on which the caps 1604 for each testing stack 1602 rests. Also shown are plates 1620, 1622 also located near the top and bottom of the testing stacks 1602 and are similar or identical to the plates 1116, 1118 described above in connection with FIG. 11. These plates 1620, 1622 have cut-outs to hold the testing stacks 1602. These plates 1620, 1622 also hold the piping or channels for the cooling system, as described above in connection with FIG. 15. It should be appreciated that the plates 1616, 1620 located near the top of the testing stacks 1602 are disposed horizontally against each other, with the plate 1616 being disposed above the plate 1620 used with the cooling system. Similarly, the plates 1618, 1622 located near the bottom of the testing stacks 1602 are disposed horizontally against each other, with the plate 1622 being disposed below the plate 1618 used with the cooling system. A main plate, such as that described in connection with FIGS. 12 and 14 may also be used to connect the stiffener 1614 and the wafer contactor 1608. In one embodiment, the plates 1616, 1620 located near the top of the testing stacks 1602, may be secured in place using pillars located on the circumference of the plates, which may then be bolted, via the plates 1618, 1622 located at the bottom of the testing stacks 1602, to the main plate such as that described in connection with FIGS. 12 and 14.

Figure 17:
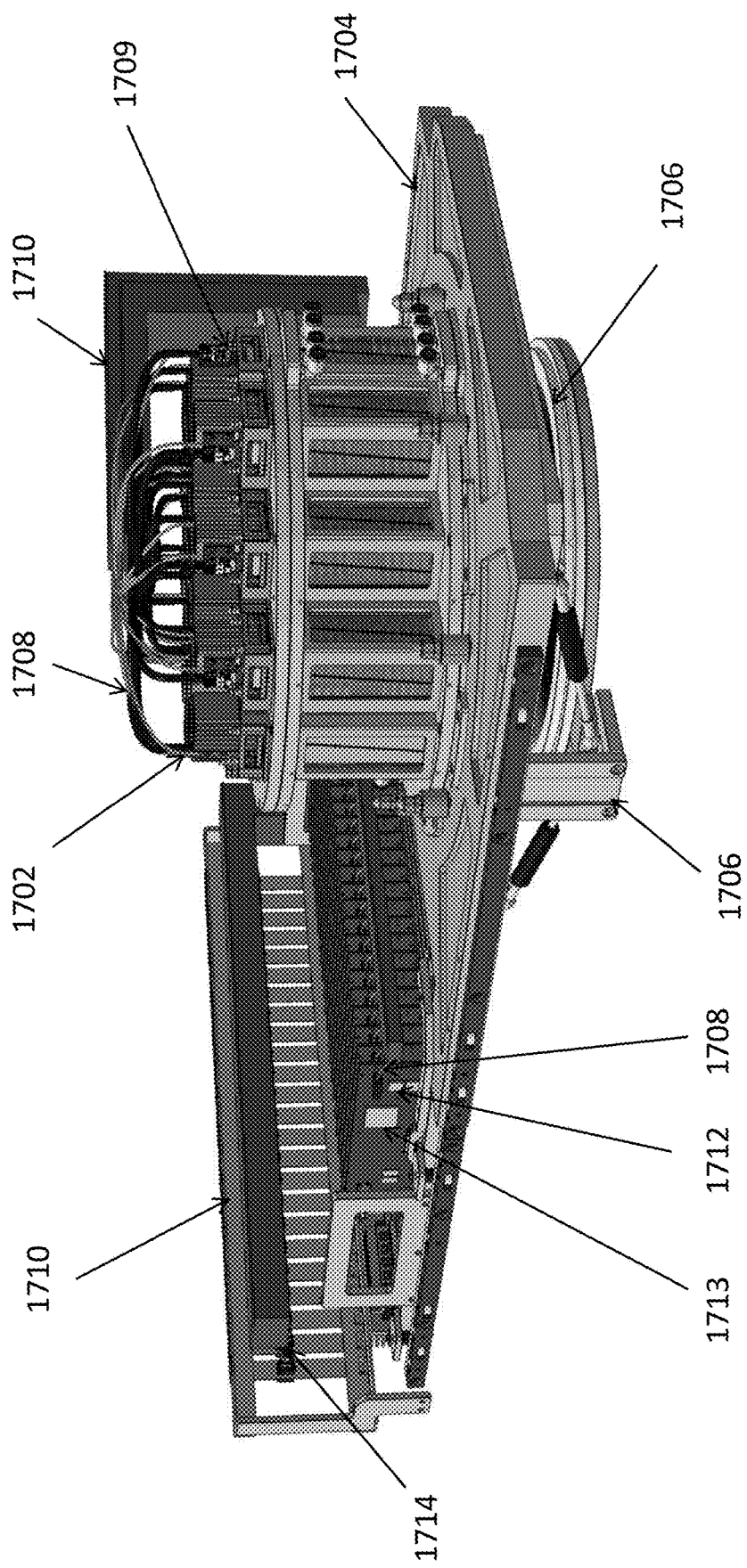
FIG. 17 illustrates a side perspective view of a wafer tester disposed on a fixed surface for use in testing a wafer according to one embodiment of the present invention.

FIG. 17 illustrates a side perspective view of a wafer tester disposed on a fixed surface for use in testing a wafer according to one embodiment of the present invention. A wafer tester 1702, such as the one shown in FIG. 16, may be mounted on a fixed surface 1704 for use. It should be appreciated that the fixed surface 1704 has an opening for receipt of the main plate, stiffener, and wafer contactor associated with the wafer tester but are not visible in FIG. 17. Wafer handling equipment 1706 may be located under the fixed surface 1704. This wafer handling equipment would be operated to locate the wafer to be tested beneath the bottom surface of the wafer contactor and to facilitate engagement of the wafer or die areas with the corresponding MEMs-type springs on the bottom surface of the wafer contactor for testing. Data cables 1708 are attached to the connectors 1709, such as the connector 910 described in connection with FIG. 9, and may be passed through a conduit or wire guide 1710 and ultimately to a corresponding host test computers (not shown). The data cables 1708 permit data transmission between the testing stacks and the test boards held by the testing stacks to and from the host test computers (not shown). In addition, a power server board 1712, including multiple power modules 1713 plugged vertically into the power server board 1712, which may also be located on the fixed surface 1704, provides power via power cables 1714 placed through the same conduit 1710 to each of the testing stacks. Therefore, in this embodiment, it should be appreciated that each testing stack is connected to a dedicated power line. It should also be appreciated that a power supply (not shown) may be located beneath the power server board 1712 to provide power to the power server board 1712 and ultimately to the testing stacks.

Accordingly, during use, a wafer would be obtained by the wafer handling equipment and placed against the bottom side of the wafer contactor and engage the electrical connectors, such as the MEMs-type springs, on the bottom surface of the wafer contactor. The test boards within each testing stack can be programmed and controlled by the server cards 1712 or host computer to facilitate testing of specific die areas on the wafer to be tested. The test boards are programmed or controlled via data I/O from the host test computers via the data cables 1708 connected to each connector on the top of each testing stack, which communicates with each test board held by the testing stack via the top circuit board, including the flex circuits that are connected to each test board along the sides of the testing stack. The bottom circuit board, including the flex circuits that are connected to each test board along the sides of the testing stack, communicates with the electrical connector at the bottom of each testing stack, which in turn, communicates with the wafer connector such that signals between the wafer die and the electrical connector at the bottom of each testing stack are passed to each other via the circuitry within the wafer contactor. One a wafer has completed testing, the wafer handling equipment may remove the wafer and secure a second wafer for testing, at which point the process can be repeated. It should be appreciated that the wafer tester and overall test systems provides a much shorter data signal path than current wafer testing equipment. As a result, data transmission rates can be much faster. In addition, it should be appreciated that the testing stacks provide modularity in that testing stacks can be easily swapped out and replaced and that each testing stack can be customized as desired to test any particular wafer or device.

Figure 18:
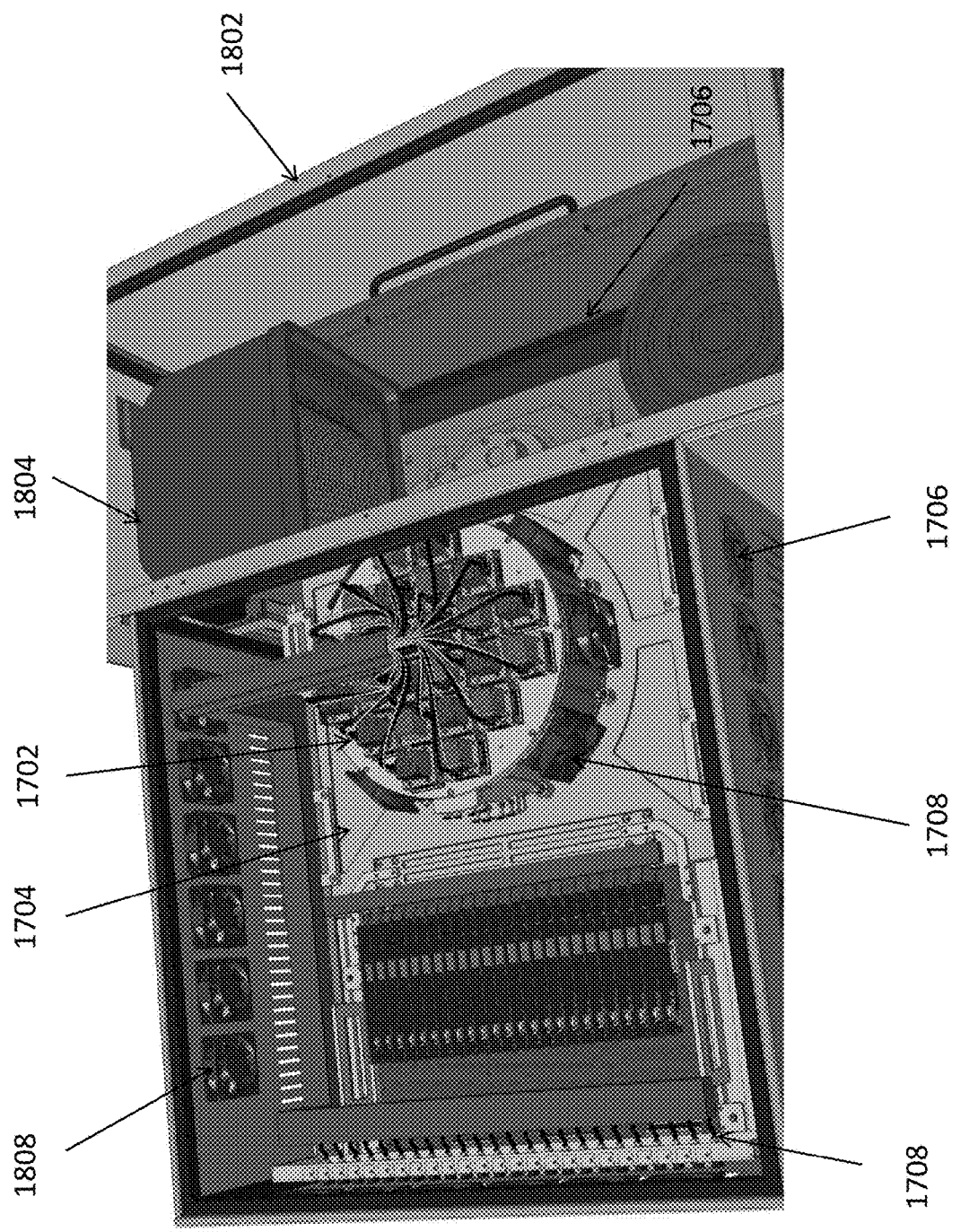
FIG. 18 illustrates a top perspective view of the wafer tester of FIG. 17 disposed within a test cabinet according to one embodiment of the present invention.

FIG. 18 illustrates a top perspective view of the wafer tester of FIG. 17 disposed within a test cabinet according to one embodiment of the present invention. The water tester 1702 on the fixed surface 1704 may be disposed within a test cabinet 1802, such as the cabinet described in connection with FIG. 1. A FOUP 1804 may be used in connection with the wafer handling equipment to house the wafers to be tested. To supplement the cooling system described above in connection with FIG. 15, the wafer tester 1702 may be surrounded by a series of fans 1806. In addition, a series of fans 1808 may be disposed within the walls of the cabinet 1802 to assist in cooling of the overall test system.

It should be appreciated that the test host computers (not shown) may located within the cabinet 1802. Alternatively, the test host computers may be located in a separate cabinet or remote to the testing cabinet 1802. In the case where the test host computers are included in the wafer tester rack, the cables 1708 from the wafer tester to the test host computers may be copper (PCIe), with the test host computers located, for example, below the power server board 1712. In the case where the test host computers may be located in a separate cabinet or different racks away from the wafer tester, the cables 1708 may be copper or PCIe over fiber, which would allow the test host computers to be moved outside of the clean room in which the wafer tester would be located and ideally in a separate server room in server racks that are much more easy to service.

What is claimed is:

1. A device for testing a silicon wafer, comprising:
a plurality of vertical stacks of test boards, wherein each of said test boards are electrically connected to a host computer;
a corresponding plurality of electrical connectors, each electrically connected to each of said test boards in a corresponding one of said vertical stacks of test boards and disposed at the bottom of said corresponding one of said vertical stacks of test boards;
a flat connector having a top side and a bottom side, wherein each of said vertical stacks of test boards and said corresponding electrical connectors is disposed on said top side of said flat connector, wherein said flat connector comprises a plurality of electrical traces for electrical connection to a silicon wafer under test, wherein each one of said electrical traces is between one of said corresponding of electrical connectors through said flat connector to a location on said bottom side of said flat connector that is directly below said one of said corresponding electrical connectors and said corresponding vertical stack of test boards.

2. The device of claim 1, further comprising:
a wafer handler for positioning a wafer having a plurality of dies to be tested under said flat connector such that each of said dies is positioned directly under a corresponding one of said vertical stacks.

3. The device of claim 1, further comprising:
a plurality of flexible electrical circuit boards each having at least one side portion extending along a side of a corresponding one of said vertical stacks and electrically connected to each of said test boards in said corresponding one of said vertical stacks, wherein each of said flexible electrical circuit boards comprises a bottom portion disposed on a bottom of said corresponding one of said vertical stacks configured for electrical connection to a corresponding one of said electrical connectors, thereby providing a consolidated single connection from each of said test boards to said flat connector.

4. The device of claim 3, wherein each of said flexible electrical circuit boards comprises four side portions, each side portion extending along one side of a corresponding one of said vertical stacks.

5. The device of claim 3, further comprising:
a second plurality of flexible electrical circuit boards each having at least one side portion extending along a side of a corresponding one of said vertical stacks and electrically connected to each of said test boards in said corresponding one of said vertical stacks, wherein each of said flexible electrical circuit boards in said second plurality comprises a top portion disposed on top of said corresponding one of said vertical stacks configured for electrical connection to the host computer, thereby providing a consolidated single electrical connection from each of said test boards to the host computer.

6. The device of claim 5, wherein each of said flexible electrical circuit boards comprises four side portions, each side portion extending along one side of a corresponding one of said vertical stacks.

7. The device of claim 1, further comprising:
a plurality of flexible electrical circuit boards each having at least one side portion extending along a side of a corresponding one of said vertical stacks and electrically connected to each of said test boards in said corresponding one of said vertical stacks, wherein each of said flexible electrical circuit boards comprises a top portion disposed on top of said corresponding one of said vertical stacks configured for electrical connection to the host computer, thereby providing a consolidated single electrical connection from each of said test boards to the host computer.

8. The device of claim 7, wherein each of said flexible electrical circuit boards comprises four side portions, each side portion extending along one side of a corresponding one of said vertical stacks.

9. The device of claim 1, wherein said flat connector comprises:
a circular portion on which each of said vertical stacks of test boards and said corresponding electrical connectors are disposed; and
a rectangular portion attached to said circular portion comprising at least one power I/O port.

10. The device of claim 1, further comprising:
a cooling system configured to pass a cooling fluid through each of said vertical stacks to remove at least a portion of the heat generated during operation.

11. The device of claim 10, wherein said cooling system comprises piping configured to pass the cooling fluid through a top portion and a bottom portion of each of said vertical stacks.

12. The device of claim 10, further comprising:
a plurality of fans to circulate air to remove another portion of the heat generated during operation.

13. A device for testing a silicon wafer, comprising:
a housing configured to hold a vertical stack of test boards for testing a silicon wafer;
a flexible electrical circuit board having at least one side portion extending vertically along a side of said vertical stack and electrically connected to each of said test boards, wherein said flexible electrical circuit board comprises a bottom portion disposed on a bottom of said vertical stack;
an electrical connector having a top side attached to a bottom side of said bottom portion of said electrical circuit board and a bottom side; and
a wafer contactor having a top side and a bottom side, wherein said housing and said electrical connector are disposed on said top side of said wafer contactor and wherein said bottom side of said wafer contactor is configured to mate with the silicon wafer;
wherein said electrical connector is configured to pass electrical signals to and from said test boards and said wafer contactor and wherein said wafer contactor provides an electrical connection between said bottom side of said electrical connector to a location on the bottom side of said wafer contactor that is directly under said vertical stack of test boards for testing a die on the silicon wafer that, during use, is positioned directly under said location on the bottom side of said wafer contactor.

14. The device of claim 13, wherein electrical signals passed between said test boards and the die on the silicon wafer travel in a vertical direction, thereby providing a minimum signal path length between said test boards and the die on the silicon wafer.

15. The device of claim 13, wherein said flexible electrical circuit board comprises four side portions, each side portion extending vertical along one side of said vertical stack.

16. The device of claim 13, further comprising:
a cooling system configured to pass a cooling fluid through a top portion and a bottom portion of said housing to remove at least a portion of the heat generated during operation; and
at least one fan to circulate air to remove another portion of the heat generated during operation.

* * * * *